United States Patent [19]
Taguchi et al.

[11] Patent Number: 5,545,993
[45] Date of Patent: Aug. 13, 1996

[54] METHOD OF MOTION TRACKING MEASUREMENT IN MR IMAGING SYSTEM

[75] Inventors: Jun'ichi Taguchi, Sagamihara; Kunihiko Kido; Koichi Sano, both of Yokohama, all of Japan

[73] Assignee: Hitachi Medical Corporation, Tokyo, Japan

[21] Appl. No.: 255,757

[22] Filed: Jun. 7, 1994

[30] Foreign Application Priority Data

Jun. 11, 1993 [JP] Japan .................................. 5-140333
Dec. 27, 1993 [JP] Japan .................................. 5-330516

[51] Int. Cl.⁶ .............................. G01V 3/00; G01V 3/14
[52] U.S. Cl. ........................................ 324/309; 324/307
[58] Field of Search .............................. 324/306, 307, 324/309, 314; 128/653.1–653.5

[56] References Cited

U.S. PATENT DOCUMENTS

| 4,994,743 | 2/1991 | Glover et al. ............................ 324/309 |
| 5,042,485 | 8/1991 | Sano et al. ............................ 324/306 X |
| 5,368,030 | 11/1994 | Zinreich et al. ..................... 324/309 X |

OTHER PUBLICATIONS

IEEE Trans, Medical Imaging, vol. 10, No. 4, pp. 548–553.
SMRM 9th Annual Meeting (1990) p. 560.
SMRM 10th Annual Meeting (1991) p. 1227.

*Primary Examiner*—Sandra L. O'Shea
*Assistant Examiner*—Mack Haynes
*Attorney, Agent, or Firm*—Antonelli, Terry, Stout & Kraus

[57] ABSTRACT

Physical quantities representing six kinds of freedom relating to parallel movement and rotation of an inspection object are detected during repetition of a measurement sequence of magnetic resonance imaging, and a direction and a position of a desired slice moved with parallel movement and rotation of the inspection object are calculated in accordance with the detection result. An intensity ratio of gradient magnetic fields in x-, y- and z-axes directions for synthesizing a slice direction gradient magnetic field, an intensity of a phase encoder gradient magnetic field and a read direction gradient magnetic field are determined so that a direction of an excitation slice coincides with the direction of the desired slice after movement. Similarly, a center frequency of excitation pulses is determined so that a position of the excitation slice coincides with the position of the desired slice after movement. Magnetic resonance signals are measured by imaging parameters so updated, and an image is reconstructed.

20 Claims, 13 Drawing Sheets

5,545,993

METHOD OF MOTION TRACKING MEASUREMENT IN MR IMAGING SYSTEM

BACKGROUND OF THE INVENTION

This invention relates to a technology for reducing artifacts resulting from movement of an inspection object during imaging in a magnetic resonance (MR) imaging system. More particularly, it relates to a method of executing an imaging operation in such a manner as to track movement of an inspection object which can be regarded as a rigid body.

U.S. Pat. No. 5,042,485 describes a method which executes an imaging operation in such a manner as to track vertical motion of the heart by changing a frequency of a radio frequency (RF) magnetic field. A slice section which is desired to be imaged moves up and down in accordance with pulsation. Therefore, this method so sets the frequency of the RF magnetic field as to track fluctuation of the resonance frequency of the imaging desired section and executes imaging so as to track the vertical motion of the heart.

Mark Hedly et al., IEEE Transactions on Medical Imaging, Vol. 10, No. 4 (1911), pp. 548–553 describes a technology which removes artifacts occurring on an image by phase correction of measurement signals when an inspection object which can be regarded as a rigid body, such as the head, causes parallel motion with respect to the imaging section. Hereinafter, explanation will be given by using symbols which are somewhat different from those used in the reference. Signal data S (K, L) when the rigid body causes parallel motion with the imaging section can be expressed as follows by signal data $S_o$ (K, L) when motion does not exist:

$$S(K, L) = S_o(K, L) \cdot exp\ (2\pi i \cdot (K \cdot \Delta X_1 + L \cdot \Delta Y_1)) \qquad (1)$$

where K is frequency spatial coordinate value in read direction,

L is frequency spatial coordinate value in encode direction, $\Delta X_1$ is a moving distance in read direction, $\Delta Y_1$ is a moving distance in encode direction.

Therefore, when phase-corrected signal data S' (K, L) is generated as expressed by equation (2), equation (3) can be obtained:

$$S'(K, L) = S(K, L) \cdot exp(-2\pi i \cdot (K \cdot \Delta X_1 + L \cdot \Delta Y_1)) \qquad (2)$$

$$S'(K, L) = S_o(K, L) \qquad (3)$$

Accordingly, the phase-corrected signal data S' (K, L) becomes equal to the signal data $S_o$ (K, L) when no motion exists.

The Mark Hedley et al. reference has a characterizing feature in that detection of the moving distances $\Delta X_1$, $\Delta Y_1$ is estimated from the artifacts appearing on the resulting reproduced image. In other words, an image is formed by removing the artifacts appearing on portions at which the inspection object does not originally exist, and the moving distances $\Delta X_1$ and $\Delta Y_1$ are estimated on the basis of the signal data generated from the image from which the artifacts are removed and on the basis of a phase difference of the original signal data. Further, the artifacts appearing on the portions at which the object does not originally exist are removed for the image reproduced from the signal of equation (2) for which correction is made, and correct estimation of $\Delta X_1$ and $\Delta Y_1$ is sequentially carried out.

H. W. Korin et al., Society of Magnetic Resonance in Medicine, 9th Annual Metting and Exhibition, (1990) p. 560 provides correction means which is effective when an inspection object which can be regarded as a rigid body, such as the head, rotates inside an imaging slice plane. This reference pays a specific attention to the fact that when the inspection object rotates inside the slice plane, the measurement signal data, too, undergoes similar rotation on a K space. Therefore, the reference method monitors the rotation by external markers, and rotates and interpolates the measurement signals containing the rotation on the K space so as to thereby obtain a corrected image free from influences of rotation.

J. P. Felmlee et al., Society of Magnetic Resonance in Medicine, 10th Annual Meeting and Exhibition, Works in progress, (1991), p. 1227 describes a technology which detects a position moving distance in a read direction inside an imaging slice plane from zero encode data referred to as "navigator echo", and applies correction to the image echo. This method sets the read direction to a transverse direction in which movement of the object can be anticipated in advance, detects the position moving distance by the navigation echo, corrects the image echo, and obtains an excellent spine image.

SUMMARY OF THE INVENTION

The prior art technologies described above are not free from the drawback that they cannot cope with the case where an inspection object, which can be regarded as a rigid body such as the head, causes arbitrary movement having a degree of freedom of 6.

It is an object of the present invention to provide a method which suppresses image degradation which takes place when an inspection object causes arbitrary movement of a rigid body having a degree of freedom of 6.

The present invention provides a method which also suppresses image degradation when the inspection object causes arbitrary movement having a degree of freedom of up to 5 by assuming a limitation to the moving direction of the inspection object.

Magnetization of a limited slice inside an inspection region of a MR imaging system is selectively excited, and a specific imaging operation for measuring magnetic resonance signals generated by excitation is repeated a plurality of times to thereby obtain a single image. Alternatively, when an animation on a single slice is obtained, the characterizing feature of the present invention resides in that a direction and a position of a slice so excited selectively as to track a desired slice to be imaged, which is fixed to the inspection object, and the position and the direction of which change in accordance with the movement of the inspection object, are changed.

Speaking more concretely, in an imaging operation such as a spin echo method, waveforms of gradient magnetic fields in three directions, that is, a slice direction gradient magnetic field, a phase encode direction gradient magnetic field and a read direction gradient magnetic field, are determined, and a direction of a slice actually selected and excited by a gradient direction of the slice direction gradient magnetic field (hereinafter referred to as an "excitation slice") is determined. The position of the excitation slice is determined by a center frequency of excitation pulses generated simultaneously with the slice direction gradient magnetic field. Further, the direction of the image is determined by the gradient direction of each of the phase encode direction gradient magnetic field and the read direction gradient magnetic field. Accordingly, the present invention detects physical quantities representing six kinds of freedom relating to the parallel movement and rotation of the inspection object during repetition of the imaging sequence, calculates the direction and the position of the desired slice after movement with the parallel movement and rotation of the inspection object, in accordance with the detection result, and determines the intensity of the gradient magnetic fields in the three-axes direction of x, y and z axes for synthesizing the slice direction gradient magnetic field so that the direction of the excitation slice coincides with the direction of the desired slice after movement. Similarly, the center frequency of the excitation pulses is determined so that the position of the excitation slice coincides with the position of the desired slice after movement, and the intensity of the gradient magnetic fields in the x-, y- and z-axes directions for synthesizing the phase encode direction gradient magnetic field and the read direction gradient magnetic field is determined in match with the direction of the image inside the slice plane of the desired slice after movement. When imaging is continued while the imaging parameters are being updated as described above, measurement data of the magnetic resonance signals, which are so imaged as to track the movement of the desired slice, can be obtained.

It is most preferred to update the imaging parameters by the detection of the physical quantities described above for each time of a predetermined number of times of scanning or in other words, at each time of excitation, but the imaging parameters may be updated by detecting the physical quantities whenever partial scanning including excitation of several times is carried out.

According to the method described above, the imaging operation can be made in such a manner that the position and the direction of the excitation slice track the motion of the desired slice due to an arbitrary movement of the inspection object. Nonetheless, the image center position inside the slice plane does not generally track the arbitrary movement of the inspection object. Accordingly, another characterizing feature of the present invention resides in that the intensity of the gradient magnetic field in the 3-axes direction and the center frequency of the excitation are determined as described above, and then the phase difference between the image center when imaging is made by using such imaging parameters and the center of the desired image is determined. The phase of the magnetic resonance signals measured is corrected by this phase difference. When an image is reconstructed from the magnetic resonance signal data so phase-corrected, a slice image can be obtained while degradation of image quality due to the arbitrary movement of the inspection object is restricted.

A typical example of the calculation of the direction and the position of the desired slice will be explained. First, a plurality of markers for detecting position/direction are fitted to the inspection object and are correctly fitted to a reference position of the inspection space of the MR imaging system. The position and the direction of the desired slice to be imaged are set under this state. Further, three-dimensional positions of a plurality of markers are detected and the position of an origin of a position/direction detection coordinate system defined on the inspection object and its three-axes directions are determined. A correlation between the position/direction detection coordinate system and the desired slice is calculated from these data and is stored in a memory. Even when the inspection object arbitrarily moves, the positional correlation between the position/direction detection coordinate system and the desired slice does not change because both of them are fixed on the inspection object.

Next, the positions of a plurality of markers are again detected before the imaging operation, and the origin position of the position/direction detection coordinate system after movement and its three-axes directions are determined. The direction and the position of the desired slice after movement are calculated from the detection result and from the correlation between the position/direction detection coordinate system and the desired slice which is previously preserved.

Video cameras may be used so as to detect the three-dimensional positions of a plurality of markers, or a magnetic resonance sequence for position/direction detection can also be used. Further, a magnetic resonance sequence for position/direction detection, which does not need the markers, is available, too. They will be explained in the section of the explanation of preferred embodiments.

The method of motion tracking measurement according to the present invention can be practiced in a more simplified form by employing a method which assumes that there is a limitation to the movement of the inspection object and the inspection object causes movement of a degree of freedom of not greater than 5, and detects physical quantities corresponding to the movement of such a limited degree of freedom.

DESCRIPTION OF THE PREFERRED EMBODIMENTS

Hereinafter, embodiments of the present invention will be dividedly explained in sections (1) to (3). The section (1) will explain the construction of a magnetic resonance imaging system, the section (2) will explain the procedures of the present invention and the section (3) will explain embodiments of position/direction detection means utilized in the procedures of the present invention.

Figure 1:
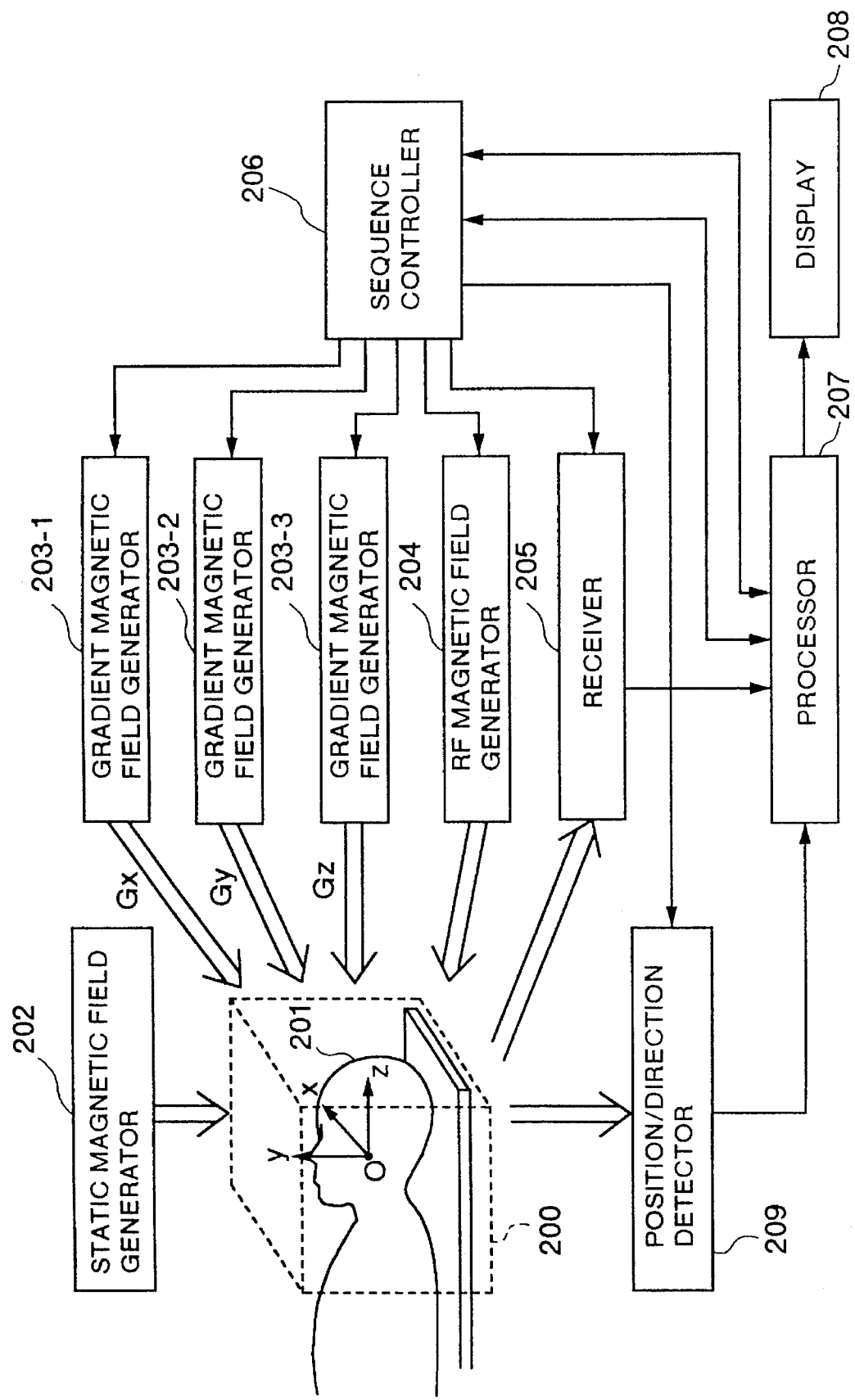
FIG. 1 is a block diagram showing a system construction of an embodiment of the present invention.
Figure 2:
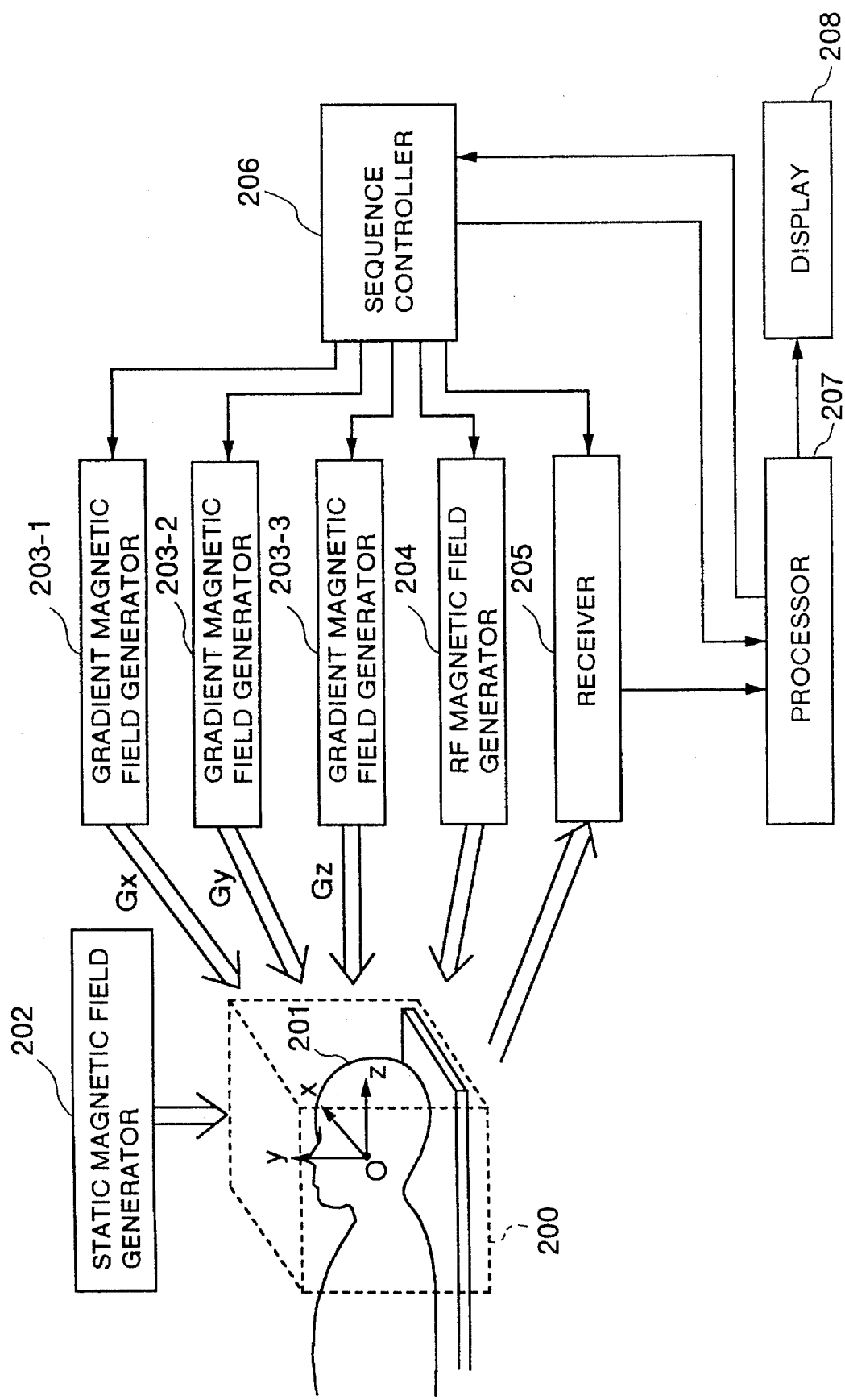
FIG. 2 is a block diagram showing a system construction of another embodiment.

(1) System construction:

FIG. 1 shows a block structural view of a magnetic resonance imaging system for practicing the present invention. FIG. 2 shows a block structural view of another magnetic resonance imaging system for practicing the present invention.

In the magnetic resonance imaging system shown in FIG. 1, a static magnetic field generator 202 generates a homogeneous static magnetic field throughout a full inspection space 200. The direction of the static magnetic field is generally in a Z-axis direction. An inspection object 201 such as the head of a patient is inserted into the inspection space 200. Magnetization develops in the inspection object 201 due to the static magnetic field. A gradient magnetic field generator 203-1 generates a gradient magnetic field Gx in an X-axis direction of the inspection space 200. Similarly, a gradient magnetic field generator 203-2 generates a gradient magnetic field Gy in the Y-axis direction, and a gradient magnetic field generator 203-2 generates a gradient magnetic field Gz in the Z-axis direction. These gradient magnetic fields in the three orthogonal directions change the Larmor frequency of magnetization in accordance with positions inside the inspection space. The generation time, intensity and polarity of these gradient magnetic fields are controlled by sequence controllers, respectively. There is only one point, at which the intensity of the magnetic field is equal to the intensity of the static magnetic field, irrespective of impression of these gradient magnetic fields, inside the inspection space 200. This point will be called the "center O" of the gradient magnetic fields. Accordingly, the system has an orthogonal coordinate system (x, y, z) having an origin thereof at the center O of the gradient magnetic fields. Hereinafter, this coordinate system inherent to this system will be referred to as the "gradient magnetic field coordinate system". The position of the center O of the gradient magnetic fields is determined at the point of time when the system is produced, and its position can be determined in advance. An RF magnetic field generator 204 generates an RF magnetic field, excites magnetization of the inspection object 201 and causes only such magnetization which satisfies a resonance condition to generate an electromagnetic wave. The combination of the gradient magnetic fields and the Rf magnetic field generates the electromagnetic wave from only a slice region which satisfies the resonance condition, and makes it possible to image such a slice region. Particularly when the direction of the imaging slice does not coincide with all of the x, y and z axes of the gradient magnetic field coordinate system, a gradient magnetic field in a desired direction is accomplished by the synthesis of at least two of Gx, Gy and Gz. A receiver 205 measures the electromagnetic wave generated when magnetization of the inspection object 201 undergoes resonance excitation, and delivers it as a signal data to a processor 207. The processor 207 preserves the signal data, reconstructs an image from the signal data, generates image data in this way, and sends the image data, etc, to a display 208, whenever necessary. The display 208 displays the image data. A sequence controller 206 controls the operations of the gradient magnetic field generator 203, the RF magnetic field generator 204, the receiver 205 and the processor 207. The sequence controller 206 has the functions of ordinary computers, and has a program for sending commands for operating each equipment and data describing the operating condition of each equipment to which reference is made by the program.

The system shown in FIG. 1 is characterized in that a position/direction detector 209 is added to the magnetic resonance imaging system described above, besides the ordinary construction. The position/direction detector 209 detects physical quantities representing six kinds of freedom relating to parallel movement and rotation of the coordinate system for detection the position/direction defined for the inspection object 201, such as the center position of the coordinate system for detection and its axial direction. A concrete example of the position/direction detector 209 will be described in the section (3). There are a large number of imaging sequences describing a series of equipment operations for slice imaging, but they generally comprise repetition of the same operations with the exception of an encode portion presented by 408 in FIGS. 5 and 11. The position/direction detector 209 is instructed by the sequence controller 206, detects the center position and the axial direction of the coordinate system for detection in the intervals of repetition, returns these physical quantities so detected to the sequence controller 206 and delivers them to the processor 207. The sequence controller 206 changes the parameters of the imaging sequence in accordance with the physical quantities so that the excitation slice coincides with the desired imaging slice. Further, the processor 207 executes correction processing of the signal data on the basis of the physical quantities described above.

In the magnetic resonance imaging system shown in FIG. 2, on the other hand, magnetic resonance measurement accomplishes the functions of the position/direction detector 209 shown in FIG. 1, too. In other words, a position detection sequence for detecting the magnetic resonance signals for deriving the center position and the axial direction of the detection coordinate system of the inspection object 201 is executed in the intervals of several times of repetition of the imaging sequences for imaging the desired slice, and the detection result is analyzed by the processor 207. Accordingly, the physical quantities representing six kinds of freedom of the detection coordinate system, which are analogous to the output of the position/ direction detector 209 of the embodiment shown in FIG. 1, are detected. The parameters of the imaging sequence for imaging the slice are sequentially changed by the sequence controller 206 in accordance with the physical quantities so detected, and the signal data obtained by this imaging sequence is corrected in the same way as in the embodiment shown in FIG. 1.

(2) Procedures

Next, the procedures of the embodiment relating to an example of a single-slice imaging will be explained in detail with primary reference to the flowchart of FIG. 3.

First, at step 101, the head of a patient as the inspection object 201 is correctly set to a predetermined position in the inspection space 200 shown in FIG. 1 or 2, and a desired slice is decided. More concretely, a rough image for deciding the desired slice is shot and is displayed on the display 208. The position and direction of the desired slice from which an image for diagnosis is desired to be obtained, and the direction and the center position of the image are set to the processor 207 by referring to the rough image. The explanation will be made further with reference to FIG. 4. By the setting operation at step 101, a unit vector $\bar{e}s$ representing the direction of the desired slice 319 (with the proviso that the direction is a direction of the thickness of the slice), unit vectors $\bar{e}r$ and $\bar{e}e$ representing the direction of the image inside the slice plane and furthermore, a position vector $\overline{OQ}$ representing the image center position Q, are set to unit vectors $\bar{e}x$, $\bar{e}y$ and $\bar{e}z$ of the three-axes directions of the gradient magnetic field coordinate system using the center O of the gradient magnetic field as the origin. Here, a coordinate system using the image center point Q as the origin and the directions of the unit vectors $\bar{e}r$, $\bar{e}e$, $\bar{e}s$ as the three axes is referred to as a "desired slice coordinate system", and $\bar{e}r$, $\bar{e}e$ and $\bar{e}s$ are referred to as a "read direction unit vector", an "encode direction unit vector" and a "slice direction unit vector", respectively.

Next, at step 102, the position and direction of the inspection object are detected as will be explained later in detail, and the relationship between the desired slice coordinate system described above and the coordinate system for detection, which is defined on the inspection object 201, is determined. The explanation will be further made with reference to FIG. 4. The coordinate system which is defined on the inspection object 201 and moves with the movement of the inspection object will be referred to as a "detection coordinate system". Its origin will be called V and its unit vectors, $\bar{e}_1$, $\bar{e}_2$, $\bar{e}_3$. As will be described later in the detection (3), the present position and direction of the inspection object 201 can be determined by the position/direction detector 209. In other words, the unit vectors $\bar{e}_1$, $\bar{e}_2$, $\bar{e}_3$ and the position of V can be determined. The unit vectors $\bar{e}r$, $\bar{e}e$, $\bar{e}s$ set previously at step 101 can be expressed as follows using these unit vectors $\bar{e}_1$, $\bar{e}_2$, $\bar{e}_3$:

$$\bar{e}r = <\bar{e}r \mid \bar{e}_1> \bar{e}_1 + <\bar{e}r \mid \bar{e}_2> \bar{e}_2 + <\bar{e}r \mid \bar{e}_3> \bar{e}_3 \quad (4)$$

$$\bar{e}e = <\bar{e}e \mid \bar{e}_1> \bar{e}_1 + <\bar{e}e \mid \bar{e}_2> \bar{e}_2 + <\bar{e}e \mid \bar{e}_3> \bar{e}_3$$

$$\bar{e}s = <\bar{e}s \mid \bar{e}_1> \bar{e}_1 + <\bar{e}s \mid \bar{e}_2> \bar{e}_2 + <\bar{e}s \mid \bar{e}_3> \bar{e}_3$$

The vector $\overline{VQ}$ from the point V to the point Q can be expressed as follows using the unit vectors $\bar{e}_1$, $\bar{e}_2$, $\bar{e}_3$:

$$\overline{VQ} = <\overline{VQ}\mid\bar{e}_1>\bar{e}_1 + <\overline{VQ}\mid\bar{e}_2>\bar{e}_2 + <\overline{VQ}\mid\bar{e}_3>\bar{e}_3 \quad (5)$$

Here, symbol <|> represents the inner product of the vectors. Since the desired slice 319 as well as the detection coordinate system are fixed on the inspection object 201, the values of the twelve inner products in the equations (1) and (2) remain unchanged even when the inspection object 201 moves and always represent the correlationship between the desired slice coordinate system and the detection coordinate system. Accordingly, it is the step 201 which detects the positions of the unit vectors $\bar{e}_1$, $\bar{e}_2$, $\bar{e}_3$ and V, calculates the values of these twelve inner products by the processor 207 and stores them in the memory in the processor 207 so as to prepare for the case where the inspection object 201 later moves.

Figure 5:
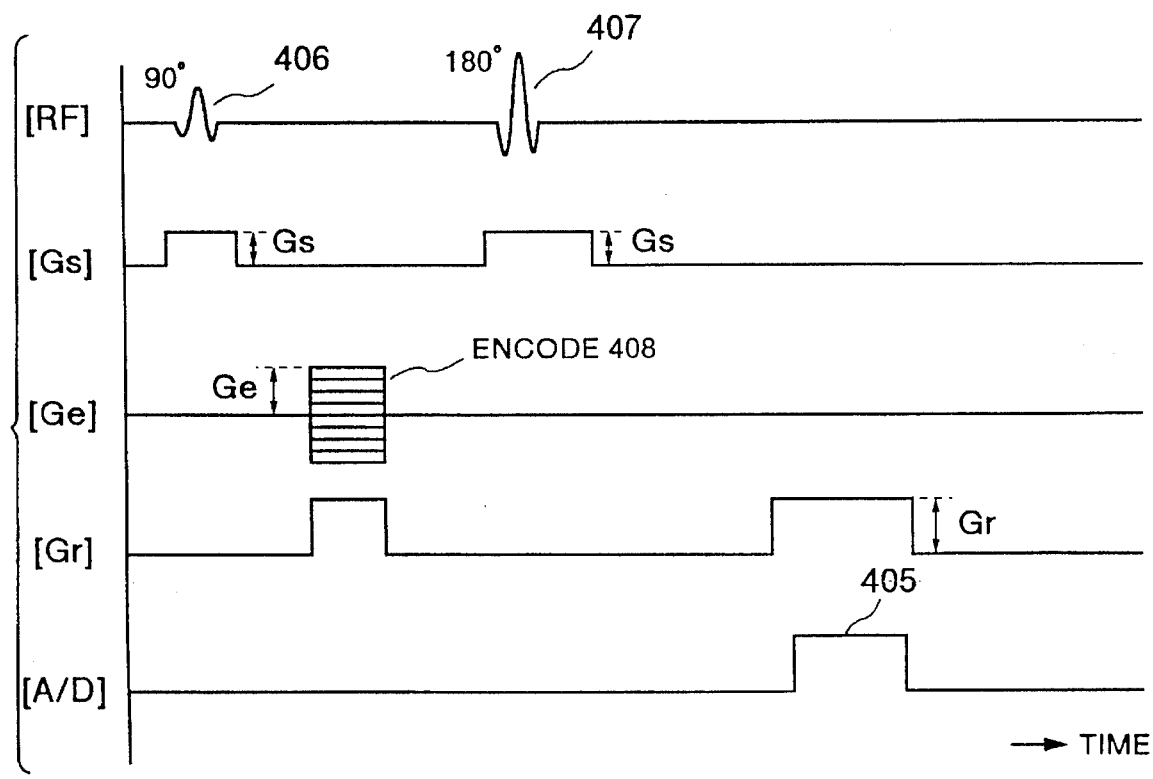
FIG. 5 is a waveform diagram showing an imaging sequence used in an embodiment.

At the next step 103, the frequency of the RF magnetic field and the intensity of each gradient magnetic field are determined among the parameters of the imaging sequence in accordance with the position and direction of the desired slice 319 determined previously at step 101 and with the direction of the image. Here, the imaging sequence of the embodiment will be explained with reference to FIG. 5. This imaging sequence is referred to as a "spin echo method", and represents one-echo sequence. The abscissa of the diagram represents the time. Symbol [RF] represents the waveform of the RF magnetic field generated by the RF magnetic field generator 204. There are two kinds of RF pulses; one being a 90° pulse 406 which excites by 90° specific magnetization and the other being a 180° pulse which inverses by 180° the specific magnetization. Symbol [Gs] represents the waveform of the gradient magnetic field in the slice direction, [Ge] represents the waveform of the gradient magnetic field in the encode direction and [Gr] represents the waveform of the gradient magnetic field in the read direction. These gradient magnetic fields in the respective directions are generated by the gradient magnetic field generators 203-1, 203-2 and 203-3, and reference numeral 405 in [AD] represents the period in which the receiver 205 sequentially samples and digitizes the echo signals. From the entire imaging operation, the portion shown in FIG. 5 is a part, and a series of the imaging operations are carried out by repeating several times the portion shown in FIG. 5 while the gradient intensity Ge at the portion 408 in the encode direction (hereinafter called the "encode portion") is being changed little by little. The number of times of repetition necessary for shooting the image is referred to as the "number of scanning". This number of scanning depends on the number of matrices of the image and on the number of times of addition, and is 512 in the case of 256 matrices and the number of scanning of 2 times.

To position the direction of the unit vector $\bar{e}s$ determined previously at step 101 to the direction of thickness of the desired slice 319, the gradient magnetic field in the slice direction may be generated as expressed by the following equation:

$$\bar{G}s(\bar{e}s) = Gs<\bar{e}s\mid\bar{e}x>\bar{e}x + \quad (6)$$
$$Gs<\bar{e}s\mid\bar{e}y>\bar{e}y +$$
$$Gs<\bar{e}s\mid\bar{e}z>\bar{e}z$$

In other words, the intensity of the X-direction gradient magnetic field is set to Gs<$\bar{e}s\mid\bar{e}x$>, the intensity of the y-direction gradient magnetic field is set to Gs<$\bar{e}s\mid\bar{e}y$>, the intensity of the z-direction gradient magnetic field is set to Gs<$\bar{e}s\mid\bar{e}z$>, and the gradient magnetic field generated by synthesizing these gradient magnetic fields in the three directions is called the "slice direction gradient magnetic field". Here, Gs represents the intensity of the slice direction gradient magnetic field at the time of selective excitation of the slice as shown in [Gs] of FIG. 5.

To position the direction of the unit vector $\bar{e}r$ to the read direction (frequency encode direction), the read direction gradient magnetic field may be generated as expressed by the following equation:

$$\overline{Gr}(\overline{er}) = Gr<\overline{er}|\overline{ex}>\overline{ex} + \qquad (7)$$
$$Gr<\overline{er}|\overline{ey}>\overline{ey} +$$
$$Gr<\overline{er}|\overline{ez}>\overline{ez}$$

In other words, the intensity of the x-direction gradient magnetic field is set to Gr<$\overline{er}|\overline{ex}$>, the intensity of the y-direction gradient magnetic field is set to Gr<$\overline{er}|\overline{ey}$>, the intensity of the z-direction gradient magnetic field is set to Gr<$\overline{er}|\overline{ez}$>, and the gradient magnetic field generated by synthesizing these gradient magnetic fields in the three directions is called the "read direction gradient magnetic field". Here, Gr represents the intensity of the read direction gradient magnetic field 404 in the signal sampling period as shown in [Gr] of FIG. 5.

Similarly, to position the direction of the unit vector $\overline{ee}$ to the encode direction (phase encode direction), the encode direction gradient magnetic field 408 may be generated as expressed by the following equation:

$$\overline{Ge}(\overline{ee}) = Ge<\overline{ee}|\overline{ex}>\overline{ex} + \qquad (8)$$
$$Ge<\overline{ee}|\overline{ey}>\overline{ey} +$$
$$Ge<\overline{ee}|\overline{ez}>\overline{ez}$$

In other words, the intensity of the x-direction gradient magnetic field is set to Ge<$\overline{ee}|\overline{ex}$>, the intensity of the y-direction gradient magnetic field is set to Ge<$\overline{ee}|\overline{ey}$>, the intensity of the z-direction gradient magnetic field is set to Ge<$\overline{ee}|\overline{ez}$>, and the gradient magnetic field generated by synthesizing these gradient magnetic fields in the three directions is called the "encode direction gradient magnetic field". Here, Ge represents the intensity of the encode direction gradient magnetic field 408 at the encode portion as shown in [Ge] of FIG. 5, and this intensity changes sequentially with the repetition of the sequence as already described.

When the imaging operation is carried out by using these gradient magnetic fields, the direction of the slice which is selected and excited in practice (hereinafter referred to as the "excitation slice") coincides with the direction of the desired slice. To further bring the positions of both slices into conformity with each other, the frequency of the system must be appropriately set. It will be hereby assumed that the center frequency fs of the RF pulse 406 is set as expressed by the following equation:

$$f_s = f_o + \gamma \cdot L_s \cdot G_s \qquad (9)$$

The reference frequency fr of the receiver 205 is set to the following equation:

$$f_r = f_o + \gamma \cdot L_r \cdot G_r \qquad (10)$$

where $f_o$ is the larmor frequency in the static magnetic field, $\gamma$ is a nuclear gyromagnetic ratio, Gs is the intensity of the slice direction gradient magnetic field described above, Gr is the intensity of the read direction gradient magnetic field intensity, and Ls and Lr are distances which will be defined later.

Figure 6:
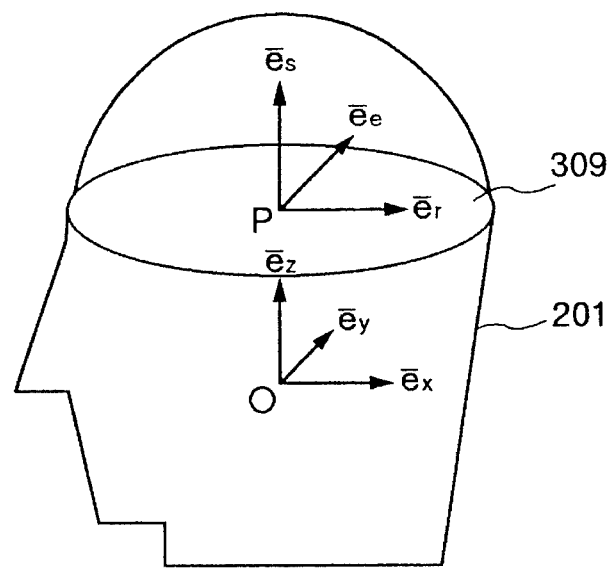
FIG. 6 is a view showing the relationship between an imaging section and a gradient magnetic field coordinate system.

The excitation slice described above has a thickness, and the section at the central position of the direction of thickness will be referred to as the "imaging section". FIG. 6 shows the coordinate system of the imaging section and the coordinate system of the gradient magnetic field system. The imaging section 309 is spaced apart by the distance Ls described above from the center O of the gradient magnetic field. Here, the point P, which is further spaced apart by the distance Lr described above from the foot of a perpendicular line extending from the center O of the gradient magnetic field towards the imaging section, in the read direction (direction of the unit vector $\overline{er}$) on the imaging section, is used as the center of the imaging section. When imaging is effected by using the parameters expressed by the equations (6) to (10) and the image is reconstructed, an image having this center P of the imaging section as its center can be obtained.

Figure 4:
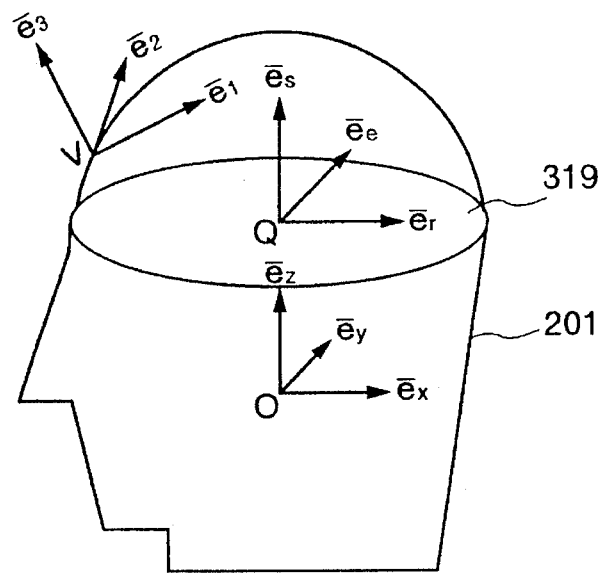
FIG. 4 is a view showing the relationship between a coordinate system for detecting a position direction and a desired slice.

Here, in order to render the desired slice 319 determined previously at step 101 and shown in FIG. 4 the excitation slice, the following equation must be satisfied:

$$L_s = <\overline{OQ}|\overline{es}> \qquad (11)$$

On the other hand, Lr is generally zero, but may be set to a value of the following equation, or to other values:

$$L_r = <\overline{OQ}|\overline{er}> \qquad (12)$$

Thus, the vector $\overline{OP}$ representing the position of the center P of the imaging section shown in FIG. 6 is given by the following equation, and the position of the excitation slice can be brought into conformity with the position of the desired slice 319:

$$\overline{OP} = L_s \cdot \overline{es} + L_r \cdot \overline{er} = <\overline{OQ}|\overline{es}>\overline{es} + L_r \cdot \overline{er} \qquad (13)$$

Figure 3:
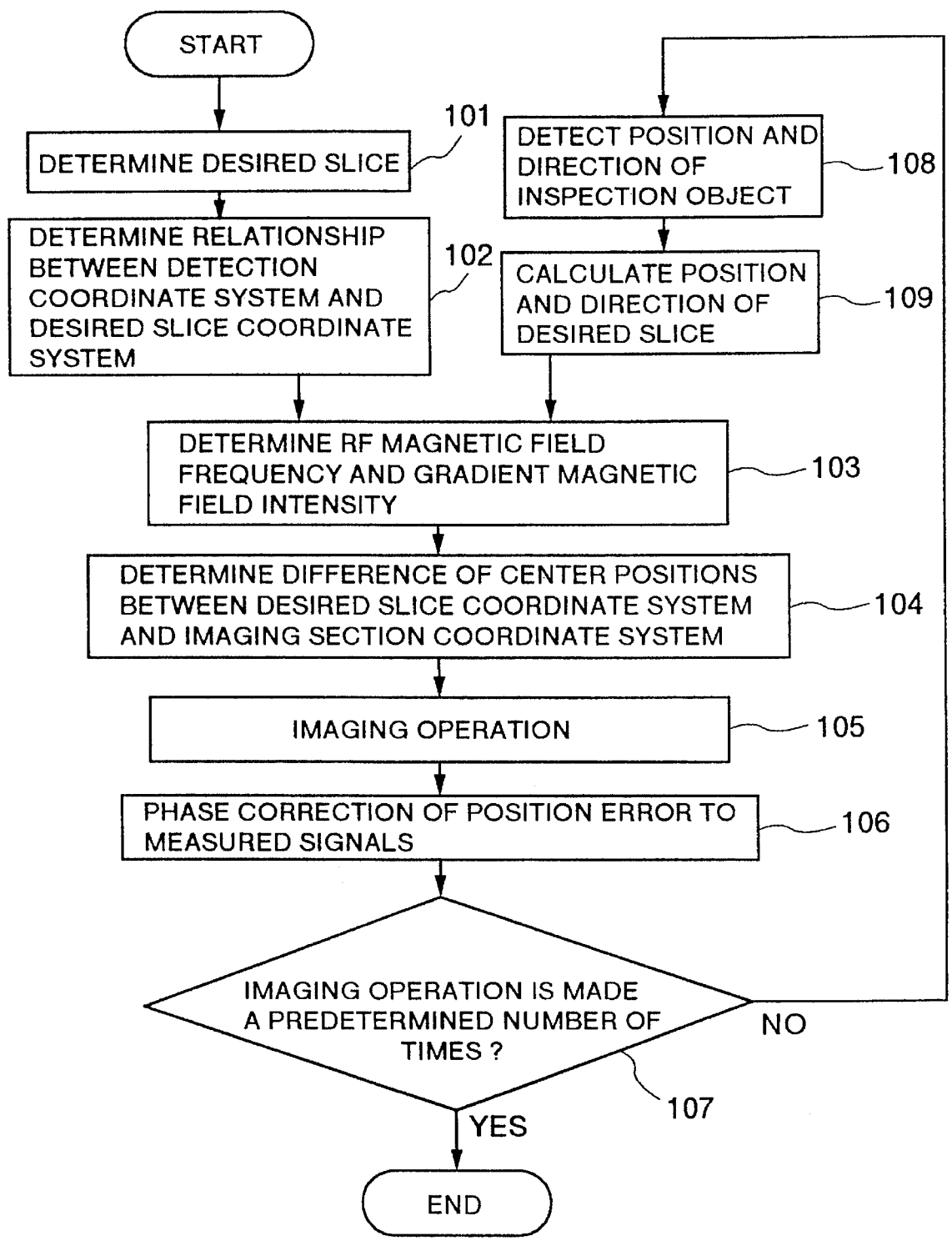
FIG. 3 is a flowchart showing procedures of an embodiment.

Accordingly, at step 103 in FIG. 3, the intensity of each gradient magnetic field, the frequency of the RF magnetic field and the reference frequency for detection are calculated by the processor 207 in accordance with the equations (6) to (11), and these parameter data are sent to the sequence controller 206. However, the position of the center P of the imaging section thus determined does not generally coincide with the position of the center O of the desired slice set at step 101 and shown in FIG. 4 and a position error exists inside the slice plane.

Figure 7:
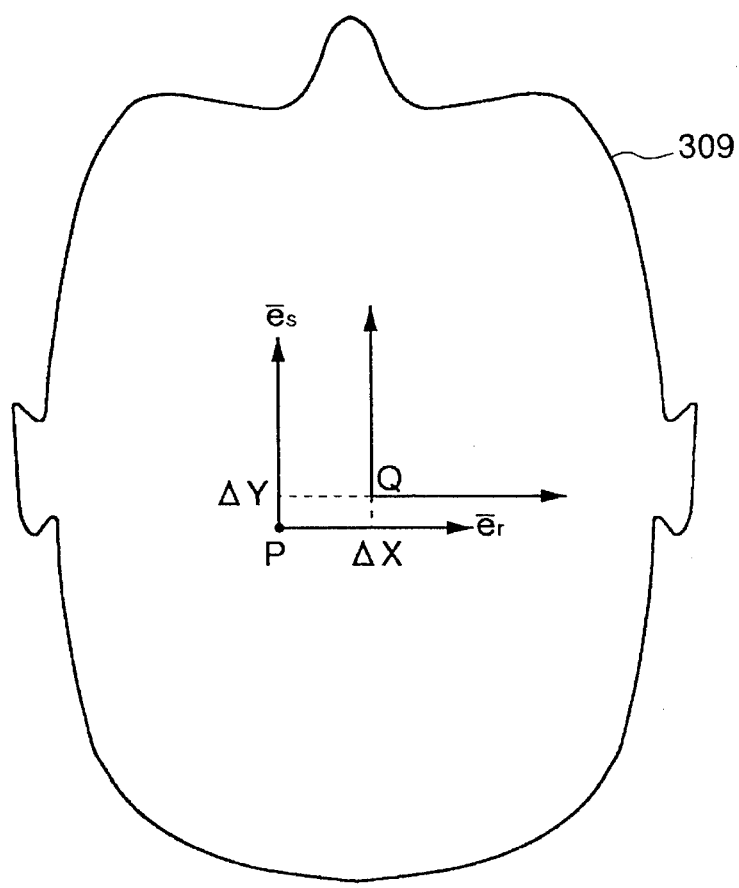
FIG. 7 is a view showing a position error between a center of an imaging section and a center of a desired slice.

The position error between the center P of the imaging section and the center Q of the desired slice is determined at step 104. FIG. 7 shows the mode of deviation between the center P of the imaging section and the center Q of the desired slice. Since the position of the center O of the gradient magnetic fields is known, the vector $\overline{OQ}$ can be determined. This vector is exploded in three directions of $\overline{es}$, $\overline{er}$ and $\overline{ee}$ as expressed by the following equation and is compared with equation (13):

$$\overline{OQ} = <\overline{OQ}|\overline{es}>\overline{es} + <\overline{OQ}|\overline{er}>\overline{er} + <\overline{OQ}|\overline{ee}>\overline{ee} \qquad (14)$$

Then, the position error between P and Q inside the slice plane, that is, the position error $\Delta x$ in the read direction and the position error $\Delta y$ in the encode direction in FIG. 7, can be determined by the following equation:

$$\Delta x = <\overline{OQ}|\overline{er}> - L_r \qquad (151)$$

$$\Delta y = <\overline{OQ}|\overline{ee}> \qquad (16)$$

Incidentally, when Lr is set as expressed by the equation (12) at step 103, the position error $\Delta x$ in the read direction becomes zero. Accordingly, there can be obtained the advantages that $\Delta x$ need not be determined at step 104 and it need not be used for correction in the subsequent processings.

At step 105, the imaging operation with a single imaging sequence or several imaging sequences shown in FIG. 5 is carried out on the basis of the intensity of each gradient magnetic field and each frequency determined at step 103 described above. By the way, scanning of 512 times, for example, must be made for imaging, and a portion of one imaging operation or a portion of repetition of several imaging operations will be called "partial scanning". The measurement signal data S (K, L) obtained by this partial scanning become the signal data when the inspection object 201 moves by the position errors $\Delta x$ and $\Delta y$. Accordingly, at the next step 106, phase correction expressed by the following equation (17) is carried out by using the position errors $\Delta x$, $\Delta y$ obtained at step 104:

$$S'(K, L) = S(K, L) \cdot exp(-2\pi i \cdot (K \cdot \Delta X + L \cdot \Delta Y)) \quad (17)$$

where S' (K, L) is signal data after phase correction, K is a frequency spatial coordinate value in the read direction, L is a frequency spatial coordinate value in the encode direction, $\Delta X$ is the position error in the read direction obtained at step 104, and $\Delta Y$ is the position error in the encode direction obtained at step 104.

In this way, it is possible to obtain the signal data S' (K, L) which is corrected as if the desired slice 319 of the inspection object 201 were in perfect conformity with the position of the excitation slice 309 inside the slice plane.

Figure 8:
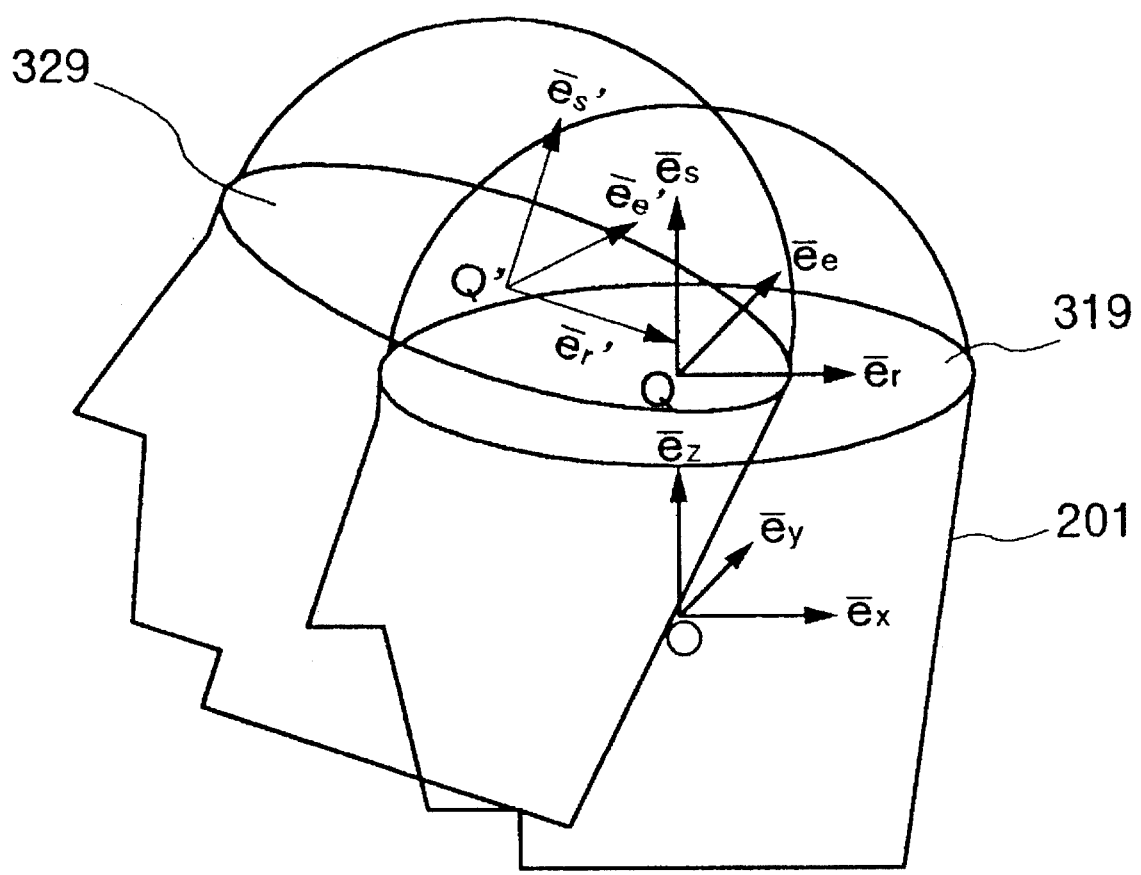
FIG. 8 is a view showing the change of a desired slice due to body motion.

At the next step 107, whether or not a predetermined number of scanning is completed is judged, and if it is completed, the imaging operation is finished and if not, the flow proceeds to step 108. When any motion exists in the inspection object 201 in the repetition interval of the execution of partial scanning at step 105, the direction and position of the desired slice in the inspection space change. In FIG. 8, the desired slice before the inspection object 201 moves is represented by reference numeral 319, and the desired slice after movement, by reference numeral 329. In other words, the origin of the desired slice coordinate system moves from Q to Q', and the unit vectors of the three axes of the desired slice coordinate system, too, change from $\bar{e}r$, $\bar{e}e$, $\bar{e}s$ to $\bar{e}r'$, $\bar{e}e'$, $\bar{e}s'$. Accordingly, detection of the origin position and direction of the detection coordinate system by position measurement of a plurality of markers, which is once carried out at step 102, is again executed.

At the next step 109, the position and direction of the desired slice after movement are calculated from the new detection result of the origin position and direction of the detection coordinate system obtained at step 108 and from the data representing the correlationship between the detection coordinate system and the desired slice coordinate system which is stored previously at step 102. In other words, when the unit vectors of the three-axes direction of the detection coordinate system obtained at step 108 are $\bar{e}_1'$, $\bar{e}_2'$, $\bar{e}3'$, the vectors $\bar{e}_1$, $\bar{e}_2$, $\bar{e}_3$ of the foregoing equation (4) are changed to $\bar{e}_1'$, $\bar{e}_2'$, $\bar{e}_3'$, and the unit vectors $\bar{e}r'$, $\bar{e}e'$, $\bar{e}s'$ of the three axes of the desired slice coordinate system after movement by the following equation, which is modified by utilizing the fact that the value of the inner product does not change:

$$\bar{e}r' = <\bar{e}r|\bar{e}_1>\bar{e}_1' + <\bar{e}r|\bar{e}_2>\bar{e}_2' + \\ <\bar{e}r|\bar{e}_3>\bar{e}_3' \quad (18)$$

$$\bar{e}e' = <\bar{e}e|\bar{e}_1>\bar{e}_1' + <\bar{e}e|\bar{e}_2>\bar{e}_2' + \\ <\bar{e}e|\bar{e}_3>\bar{e}_3'$$

-continued
$$\bar{e}s' = <\bar{e}s|\bar{e}_1>\bar{e}_1' + <\bar{e}s|\bar{e}_2>\bar{e}_2' + \\ <\bar{e}s|\bar{e}_3>\bar{e}_3'$$

The position vector $\overline{OQ'}$ of the origin Q' of the desired slice coordinate system after movement can be obtained by the following equation by using the position vector $\overline{OV'}$ of the origin V' of the detection coordinate system obtained at step 108:

$$\overline{OQ'} = \overline{OV'} + \\ <\overline{VQ}|\bar{e}_1>\bar{e}_1' + <\overline{VQ}|\bar{e}_2>\bar{e}_2' + \\ <\overline{VQ}|\bar{e}_3>\bar{e}_3' \quad (19)$$

Subsequently, steps 103 to 107 are executed, and the loop consisting of steps 108, 109, 103, 104, 105, 106 and 107 is repeated until the end of a predetermined number of times of scanning is judged at step 107. However, determination of the parameters of the intensity of each gradient magnetic field and the frequency at step 103 and calculation of the position error $\Delta x$ in the read direction and the position error $\Delta y$ in the encode direction inside the slice plate at step 104 are carried out by using the origin position and the unit vectors of the desired slice coordinate system which is calculated afresh at step 109 of the repetition loop. Accordingly, even when the inspection object 201 moves in an arbitrary direction or rotates at an arbitrary angle during the repetition of the imaging sequence, the direction and position of the excitation slice in partial scanning at step 105 are always in conformity with those of the desired slice of the inspection object. Further, the phase of the resulting signal measurement data is corrected at step 106, and signal measurement data always using the image center position first set at step 101 as the center can be obtained.

The processor 207 executes image reconstruction for these data accumulated in the procedures described above, and obtains the desired slice image.

Figure 9:
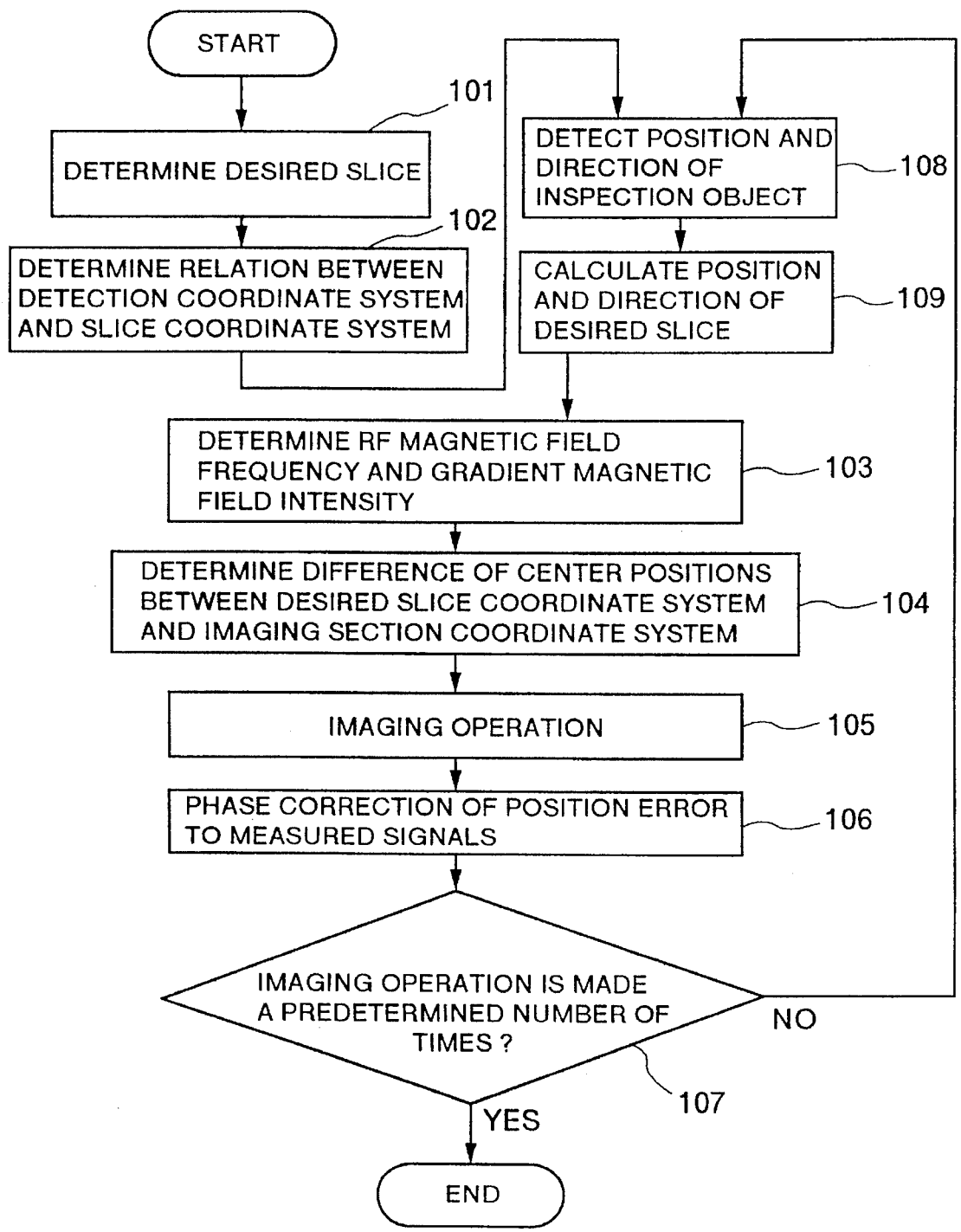
FIG. 9 is a flowchart showing procedures obtained by partly changing the procedures shown in FIG. 3.
Figure 10:
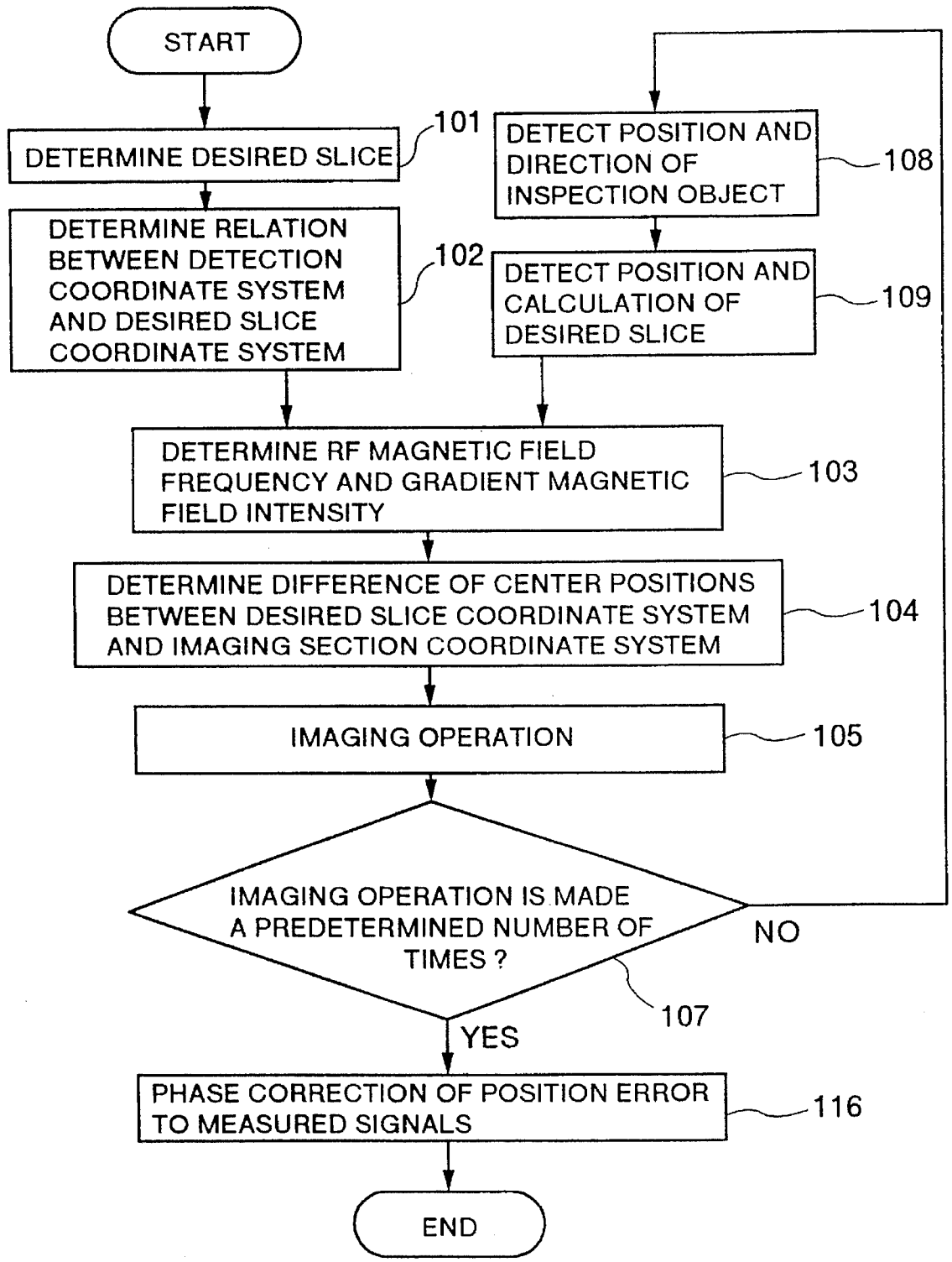
FIG. 10 is a flowchart showing other procedures obtained by partially modifying the procedures shown in FIG. 3.

The procedures described above and shown in FIG. 3 can be changed. FIGS. 9 and 10 show modified examples.

In FIG. 9, the procedures flowing from step 102 to step 103 in FIG. 3 is so changed as to jump from step 102 to step 108. The procedure shown in FIG. 9 is equal to the execution of steps 108 and 109 during the flow of step 102 to 103. The procedures shown in FIG. 9 provides the advantage that when the time from step 102, at which the desired slice is determined, to step 103 is relatively long, the influences of body motion can be eliminated during this period because the position and the direction are again detected at step 108 even when any body motion exists between step 102 and step 103.

The procedure shown in FIG. 10 omits the phase correction of the measurement signals, which is effected at step 106 in FIG. 3, but collectively effects the phase correction of all the measurement signals by adding step 116 after the imaging operation is completed. When the signal data obtained at step 105 is immediately phase-corrected as in FIG. 3, it is not necessary to preserve the information representing at which time of step 104 the data of the position error is obtained, by merely and immediately referring to the data of the position error obtained at step 104, at step 106. In the case of FIG. 3, therefore, a determined memory address can be used for the data exchange of the position error. In the case of FIG. 10, however, it is necessary to preserve the information at which time of step 104 the data of the position error is obtained, and for this reason, a table representing correct correspondence between the number of times and the data becomes necessary.

The above illustrates two examples of the modified examples of the procedures of FIG. 3, but various other modifications can also be made. For example, the modifications of FIGS. 9 and 10 can be simultaneously made, or the sequence of step 103 can be exchanged by step 104.

In multi-slice imaging, imaging of other slices is executed during a wait time of repetition. In such a case, the portion shown in FIG. 5 corresponds to one partial scan of one slice, and partial scan of other slices is effected before the next partial scan of the same slice is made. The imaging operation effected at step 105 may be one partial scan of one slice or may be partial scan of several slices. Further, partial scan of all the slices may be carried out once or dividedly several times.

Figure 11:
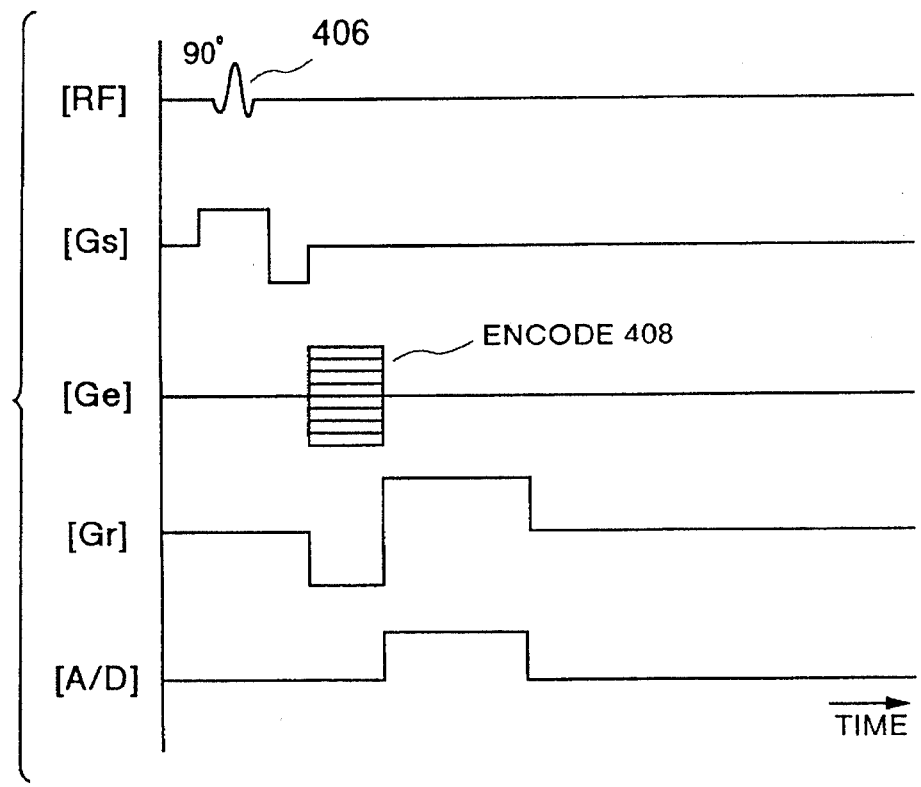
FIG. 11 is a waveform diagram showing another example of the imaging sequence used in an embodiment.

Furthermore, the imaging sequence that can be employed in the embodiment is not limited to the sequence shown in FIG. 5. FIG. 11 shows the imaging sequence based on a gradient echo method. In the imaging sequence shown in FIG. 11 which is based on the gradient echo method, there is the case where a pulse having an excitation angle smaller than 90° is used in place of the 90° pulse 406 and high speed imaging is carried out by reducing the repetition time. When high speed imaging is made, the imaging time per image is short. Accordingly, it is possible to shoot the image of the same portion a plurality of times and to inspect the change with time. In such a case, the imaging operation of step 105 can measure a single or a plurality of images besides the imaging operation described above.

Figure 12:
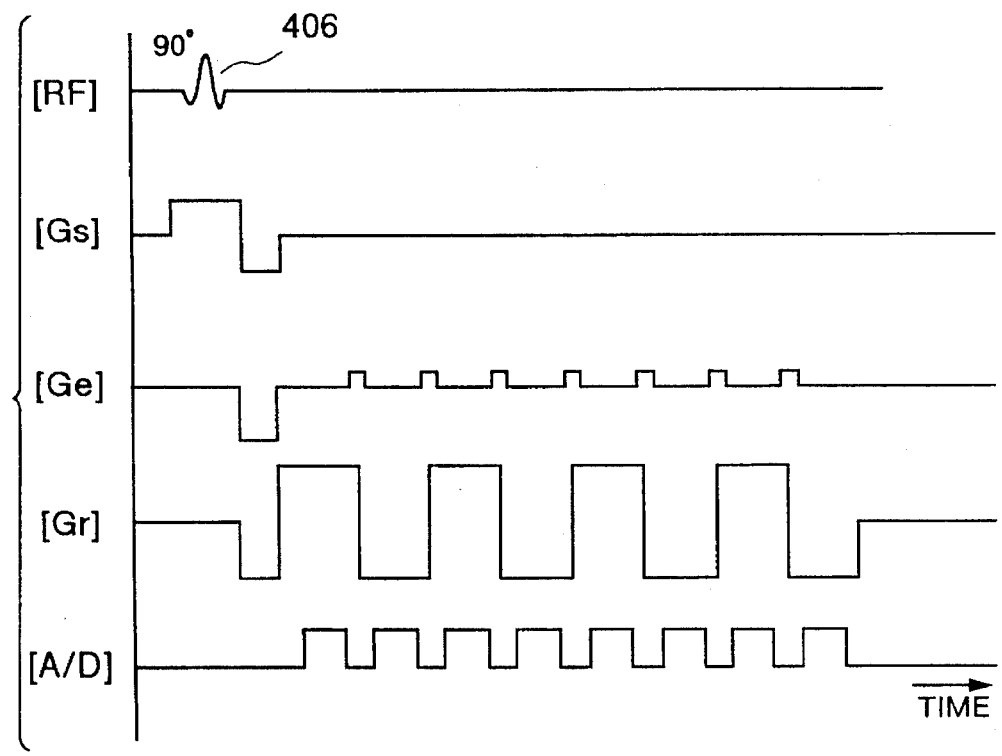
FIG. 12 is a waveform diagram showing still another example of the imaging sequence used in an embodiment.

FIG. 12 shows an example of a ultra-high speed imaging sequence on the basis of an echo planar method, and a single operation of the portion shown in the drawing can obtain one image. Ultra-high speed imaging can shoot many times the image of the same portion and can examine the change of the portion with the passage of time. In such a case, the imaging operation at step 105 makes measurement of one of a plurality of images.

A large number of other imaging sequences are described in the magazine "Magnetic Resonance in Medicine" and "IEEE Transactions on Medical Imaging", and such imaging sequences can be employed, too.

(3) Detection of Position and Direction

A large number of methods may be used to detect the position and direction of the inspection object. The method using the position detector 209 in the embodiment shown in FIG. 1 will be explained in the section (3-1), and the method which detects the position and direction of the inspection object by nuclear magnetic measurement without using the position detector 209, in the embodiment shown in FIG. 2, will be explained in the section (3-2).

(3-1) Method Using Position/Direction Detector 209

An example using a video camera as the position/direction detector 209 will be explained with reference to FIGS. 13 and 14.

Figure 13:
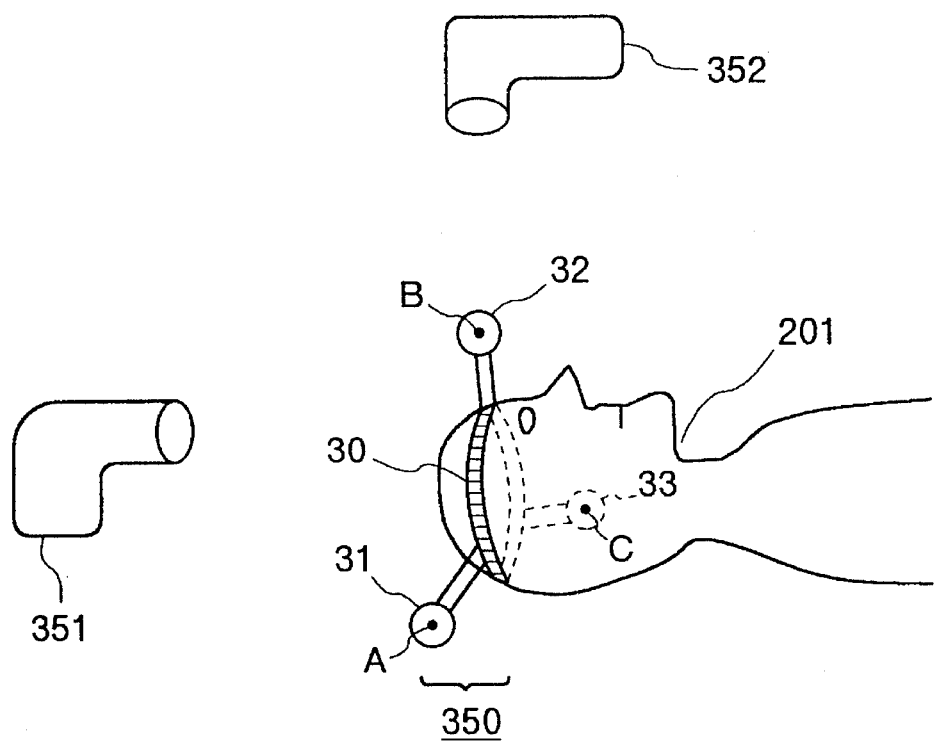
FIG. 13 is a conceptual view showing an example of a position/direction detector of an embodiment.

A position/direction detection marker 350 is fitted to the head of a patient as the inspection object 201 as shown in FIG. 13. The position/direction detection marker 350 comprises a band 30 which is brought into close contact with the head, and marker balls 31, 32, 33 which are fixed to the band and mutual positional relation of which does not change. Since the ball appears circular from all the directions, the centroid of the ball from each direction can be easily known. Two video cameras 351, 352 are fixed to the nuclear magnetic resonance imaging system in such a manner as to face the inspection space. The inspection object 201 to which the position/direction detection marker 350 is fitted is inserted into a substantially determined position inside the inspection space. Accordingly, even when the imaging range of the video cameras 351, 352 is fixed, the position/direction detection marker 350 can be displayed as a whole in the image taken by each video camera. The size of each marker ball in the image, too, is substantially determined. Accordingly, when a circle having a predetermined size is detected by matching from inside the image and the center position of the circle is determined, the centroid of the marker ball in the imaging plane of the video camera shooting the image can be known. Since the image is monitored by the two video cameras shooting the image from different angles, the three-dimensional position of the centroid of the marker ball can be known. Incidentally, the size and color of each marker ball can be changed for easy discrimination of the three marker balls. Particularly when a different color is applied to each marker ball, a marker can be easily distinguished from the other markers on the image from the color information. Once the position of the marker is detected, the moving distance is small within a short time and on the basis of this fact, the next marker can be detected by starting the search of the marker from the previous detection position to find out neighboring markers. In this way, the markers can be found out at a high speed.

Figure 14:
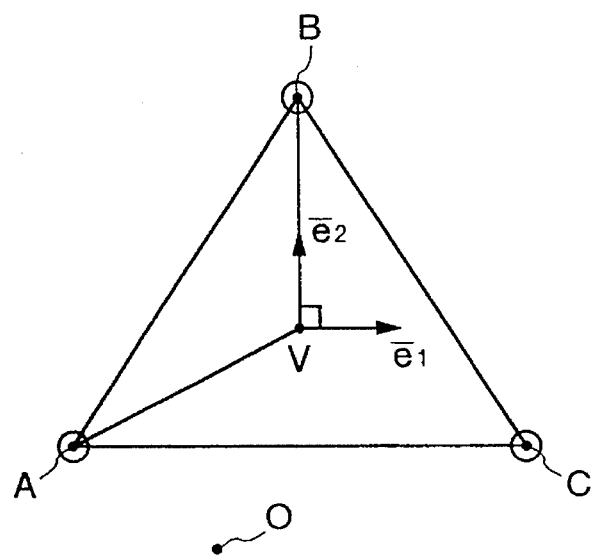
FIG. 14 is a view showing the relationship between positions of three marker balls and a coordinate system for detecting directions and positions.

When the three-dimensional positions of the centroids A, B, C of the three marker balls are detected in the manner described above, the center position of the coordinate system for detecting the direction/position and its direction can be determined as shown in FIG. 14. Hereinafter, the explanation will be given by using numerical formulas. By the way, the position of the center O of the gradient magnetic fields is given already.

The centroid V of a triangle ABC is used as the position/direction detection reference position (the origin of the detection coordinate system). The direction detection unit vector represented by $\bar{e}_1$ is taken in parallel with a vector $\overline{AC}$ extending from A to C, and another direction detection unit vector represented by $\bar{e}_2$ is taken perpendicularly to $\overline{AC}$ inside the plane of the triangle ABC. Since the position/direction detection reference position V is the centroid of the triangle ABC, a vector extending from 0 to V is represented by $\overline{OV}$ with the same expression for other vectors, the following equation can be obtained:

$$\overline{OV}=(\overline{OA}+\overline{OB}+\overline{OC})/3 \qquad (20)$$

The direction detection unit vector $\bar{e}_1$ is in parallel with the vector $\overline{AC}$ extending from A to C. Therefore, this vector $\bar{e}_1$ can be given as follows when the absolute value of the vector is expressed by ||;

$$\bar{e}_1\overline{AD}/|\overline{AC}| \qquad (21)$$

The direction detection unit vector $\bar{e}_2$ is a vector which is perpendicular to the vector $\overline{AC}$ extending from A to C inside the plane of the triangle ABC. If the triangle ABC is an equilateral triangle or an isosceles triangle where a side AB is equal to a side CB, the vector $\bar{e}_2$ and the vector $\overline{VB}$ are in parallel with each other as shown in FIG. 14, and the vector $\bar{e}_2$ can be easily obtained as described below:

$$\bar{e}_2=\overline{VB}/|\overline{VB}| \qquad (22)$$

When both vectors $\bar{e}_1$ and $\bar{e}_2$ are obtained, the unit vector $\bar{e}_3$ orthogonally crossing both of them can also be determined. In this way, the three-dimensional positive of v representing parallel movement of the inspection object and the unit vectors $\bar{e}_1, \bar{e}_2, \bar{e}_3$ representing the rotation of the inspection object can be obtained by detecting the three-dimensional positions of the three markers fixed to the inspection object, and physical quantities representing all of six kinds of freedom relating to parallel movement and rotation of the inspection object, which can be regarded as a rigid body, can be detected.

The explanation given above represents the example where the position and the direction are detected by using two sets of video cameras. Position detection accuracy can be improved by effecting monitoring from three directions by using three sets of video cameras. On the contrary, only motion of the body having its center in a planar direction perpendicular to the body axis direction can be detected by assuming that no vertical motion exists in the body axis direction, and various other modifications may be possible. Incidentally, a large number of apparatuses for detecting the position and direction of an article have been proposed in the field of virtual reality study, and so forth. The present invention can utilize such apparatuses for detecting the position and the direction as the position/direction detector 209. For example, the present invention can use a ultrasonic sensor used for a "2D/6D Mouse" of Logitech Inc. In this case, a filter for removing noise is disposed in a signal line extending from the controller of the ultrasonic sensor to a ultrasonic transmitter or receiver in order to prevent the noise from mixing in each magnetic resonance imaging system.

(3-2) Position/Direction Detection Method by Magnetic Resonance Measurement

Figure 15:
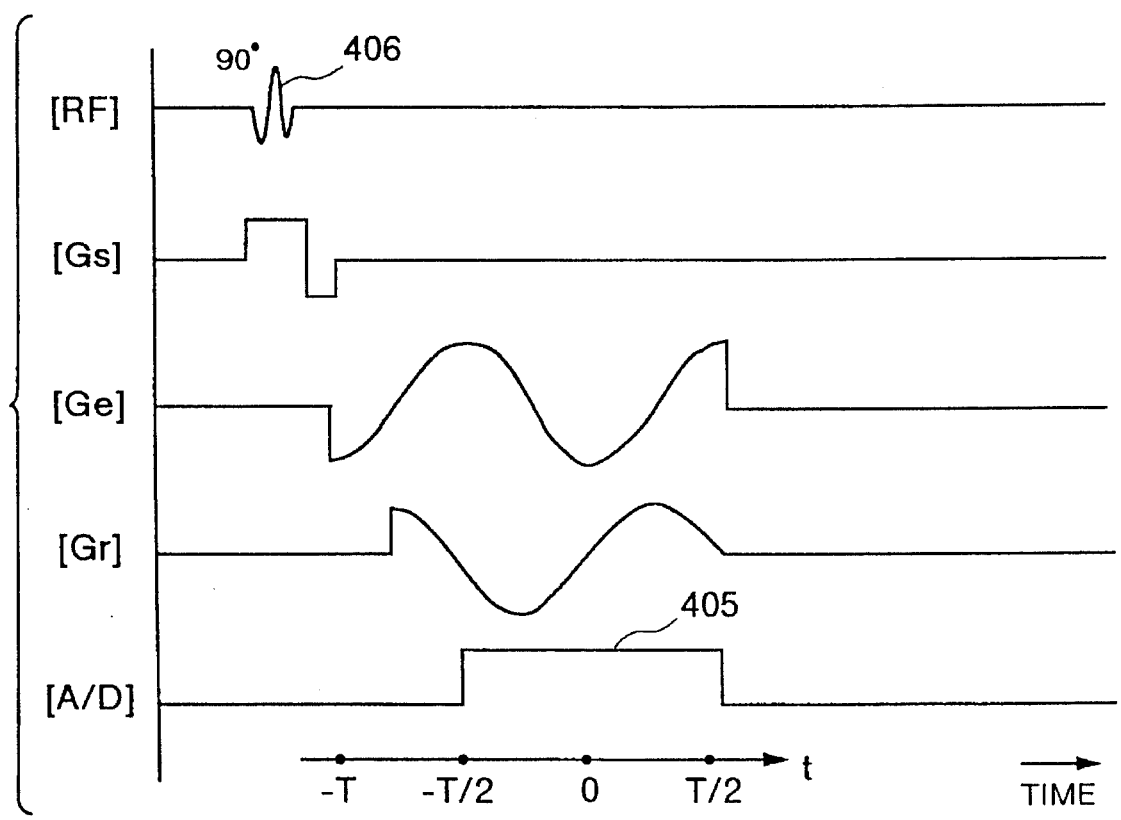
FIG. 15 is a waveform diagram showing an example of a measurement sequence for detecting a position and a direction by magnetic resonance measurement.

FIG. 15 shows the sequence for detecting the parallel movement and the rotation quantity inside the imaging plane. To apply this sequence to the embodiment shown in FIG. 3, this detection sequence is first executed at step 102, and this detection sequence is again executed at step 108 and the detection result is compared with that of step 102 so as to analyze the movement and the rotation quantity of the inspection object. Incidentally, the position/direction detection coordinate system can be used in this case as the desired slice coordinate system. Accordingly, it is not necessary to determine the relationship between the position/direction detection coordinate system and the desired slice coordinate system as step 102. Insteads, the detection sequence shown in FIG. 15 is executed at step 102, and later-appearing reference position/direction signal data are acquired and preserved. No change exists for the rest of steps. Hereinafter, the position/direction detection method will be explained with reference to FIG. 15.

In FIG. 15, symbol [RF] represents the waveform of the RF magnetic field, [Gs] represents the waveform of the slice direction gradient magnetic field, [Ge] represents the waveform of the encode direction gradient magnetic field and [Gr] represents the waveform in the read direction. Symbol [A/D] represents the sampling period of the signal. This sequence measures the signals in a circular region having the origin on a K space as the center thereof by a single operation of portions shown in the drawing. The K space is the space which means the frequency when the image is subjected to Fourier transform, and an integration value of the gradient magnetic fields from the application of the 90° pulse 406 to the measurement determines the coordinates of the K space. Hereinafter, the measurement of the signals in the circular region having the center thereof at the origin of the K space by the position/direction sequences shown in FIG. 15 will be explained with reference to numerical formulas.

The time t is defined by setting the point of time at the center of the sampling period 405 of the signals to 0. The intensity G(t) of the read direction gradient magnetic field and the intensity Ge(t) of the encode direction gradient magnetic field are expressed by the following equations, respectively:

$$Gr(t) = \begin{cases} 0 & \dots t \leq -3T/4, T/2 \leq t \\ R \cdot \sin(2\pi t/T) & \dots -3T/4 \leq t \leq T/2 \end{cases} \quad (23)$$

$$Ge(t) = \begin{cases} 0 & \dots t \leq -T, T/2 \leq t \\ -R \cdot \cos(2\pi t/T) & \dots -T \leq t \leq T/2 \end{cases} \quad (24)$$

Here, T is the sampling period and R is an appropriate constant. When the gradient magnetic fields described above are applied, the signal data at the point (k, l) on the K space expressed by the following formulas can be obtained at each time t of measurement:

$$\begin{aligned} k &= \int Gr(\tau)d\tau[-3T/4 \leq \tau \leq t] \\ &= -R \cdot \cos(2\pi t/T) + R \cdot \cos(2\pi(-3T/4)/T) \\ &= -R \cdot \cos(2\pi t/T) \end{aligned} \quad (25)$$

$$\begin{aligned} l &= \int Ge(\tau)d\tau[-T \leq \tau \leq t] \\ &= -R \cdot \sin(2\pi t/T) + R \cdot \sin(2\pi(-T)/T) \\ &= -R \cdot \sin(2\pi t/T) \end{aligned} \quad (26)$$

Here, k and l have the following relation:

$$k*k + l*l = R*R \quad (27)$$

Accordingly, it can be understood that the point (k, l) on the K space is the point on the radius R having the center thereof at the origin. It can be further understood that the point (k, l) exists at the point (R, O) on the circumference at a time −T/2, turns counterclockwise with the passage of time, and makes a round at the time T/2. In other words, the measurement data for one circumference on the circumference having the radius R on the K space can be obtained by signal measurement from the time −T/2 to the time T/2 of the sequence shown in FIG. 15.

Next, the method for determining the position and the direction by obtaining the parallel movement and the rotation quantity inside the imaging section from the measurement signals of the circumferential region on the K space measured as described above will be explained.

While the inspection object 201 faces the reference position and direction, the sequence for detecting the position/direction described above is operated at a certain time. Then, the resulting measurement signals of the circumferential region on the K space will be called "reference position/direction signal data". The measurement signals of the circumferential region on the K space, which are obtained by operating the sequence portion for detecting the position/direction described above after the inspection object 201 moves, will be called "position/direction detection signal data". More concretely, the slice direction, the encode direction and the read method at the point of time when the imaging desired slice is determined at step 101 are used as the axial direction of each axis in the sequence shown in FIG. 15, and the sequence shown in FIG. 15 is executed at step 102. The data obtained in this manner are the position/direction detection data. The parallel movement distance and the rotation quantity of the inspection object 201 from the reference position are determined by comparing the position/direction detection signal data with the reference position/direction signal data; hence, the position and the direction can be known. Hereinafter, the explanation will be made by defining the reference position/direction signal data as $U_o(n)$, the position/direction detection signal data as $U(n)$ and the Fourier transform, as F. By the way, symbol n represents the sampling sequence of measurement, and measurement is made equidistantly time-wise from 1 to N. At n=N+1, the measurement makes a round and becomes equal to that of n=1.

The parallel movement of the inspection object 201 inside the imaging section changes the phase of the signal data and its rotation results in the rotation of the signal data. When the absolute value of the signal is taken, the data of the parallel movement disappears and the data becomes only the data of rotation. Since $U_o(n)$ and $U(n)$ are data on the circumference, the data is defined as becoming cyclic at N, and when the deviation on the circumference due to the rotation is r, the following equation is given:

$$|U(n-r)|=|U_o(n)| \tag{28}$$

Accordingly, the rotation quantity can be determined by obtaining the deviation r on the circumference by comparing the data $|U(n)|$ with the data $|U_o(n)|$. By the way, comparison between the data $|U(n)|$ and the data $|U_o(n)|$ can be made by calculating correlation, or r can be obtained from the phase difference of the data $F(|U(n)|)$ and $F(|U_o(n)|)$ through Fourier transform. Incidentally, when r is obtained by Fourier transform, the advantage that r can be determined below the sampling interval can be obtained.

When the rotation quantity is known as described above, the parallel movement distance can be known from the comparison of the phases of $U(n-r)$ and $U_o(n)$. Its principle is expressed by the equation (1) with reference to the prior art technology. Incidentally, when r is determined by Fourier transform and it is obtained below the sampling interval, the data of $U(n-r)$ can be obtained by subjecting the data of $U(n)$ of Fourier transform, effecting phase compensation corresponding to the movement of r, and thereafter effecting inverse Fourier transform.

The above explains the method which measures the parallel movement distance and the rotation quantity inside the slice section of the inspection object 201 by measuring the signals in the circular region of the K space by the position/direction detection sequence and determines the position and the direction. The above explains the position/direction detection means which can cope only with the body motion in the imaging section, but all the movements of six kinds of freedom can be detected by measuring the signals of the spherical region having the center thereof at the origin of the K space. In other words, the reference position/direction signal data obtained by operating the sequence portion for detecting the spherical region when the inspection object 201 faces the reference position and direction is compared with the position/direction detection signal data obtained by operating the sequence portion for detecting the position/direction of the spherical region after the inspection object 201 moves, and in this way, three-dimensional rotation and parallel movement can be known, and the position and the direction can be determined.

Next, another method of detection the position and the direction of the inspection object by magnetic resonance measurement will be explained with reference to FIGS. 16 and 17.

A marker analogous to the position/direction detection marker 350 shown in FIG. 13 is fitted to the inspection object in this method. However, three marker balls 31, 32, 33 of the position/direction detection marker used in this method are made of a compound having a strong chemical shift. A suitable definite example of the marker ball is tetro-methyl-titanium having a chemical shift of 4.5 ppm. Further, a compound having a chemical shift having such a strength as to be capable of excitation independently of the living body consisting primarily of water and fats (chemical shift 0 to 3 ppm) can also be used as the material of the marker ball.

Figure 16:
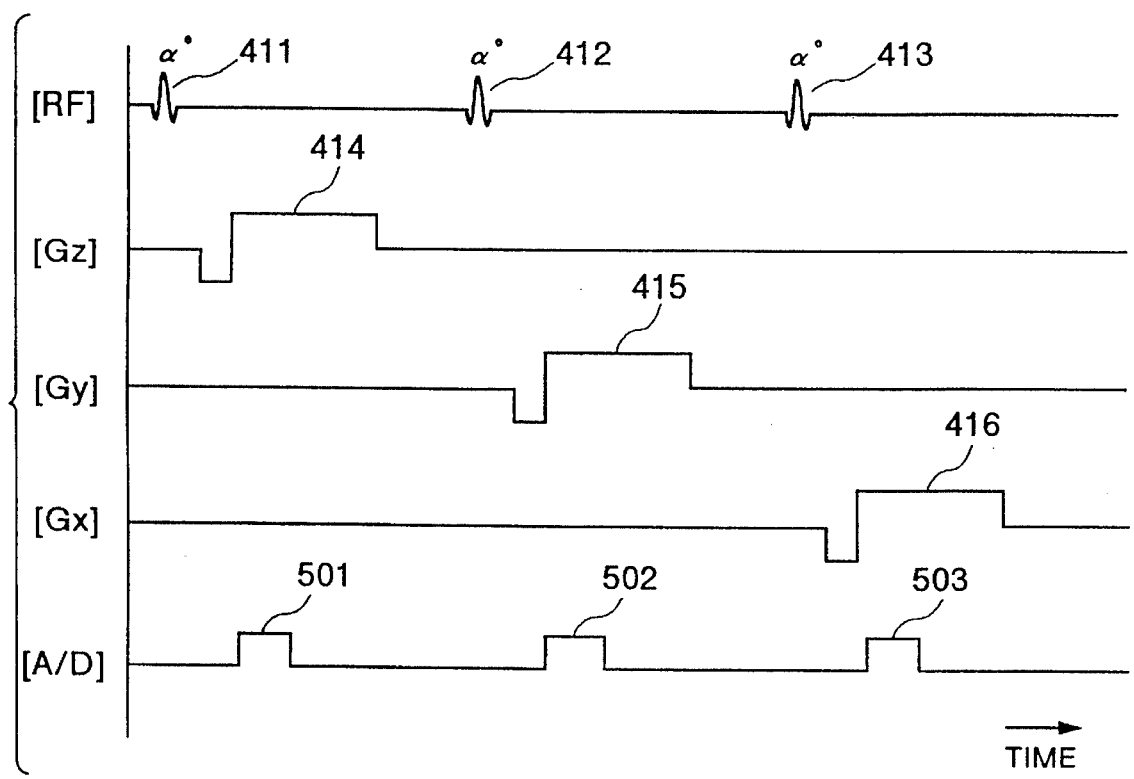
FIG. 16 is a waveform diagram showing another example of a measurement sequence for detecting a position and a direction.
Figure 17:
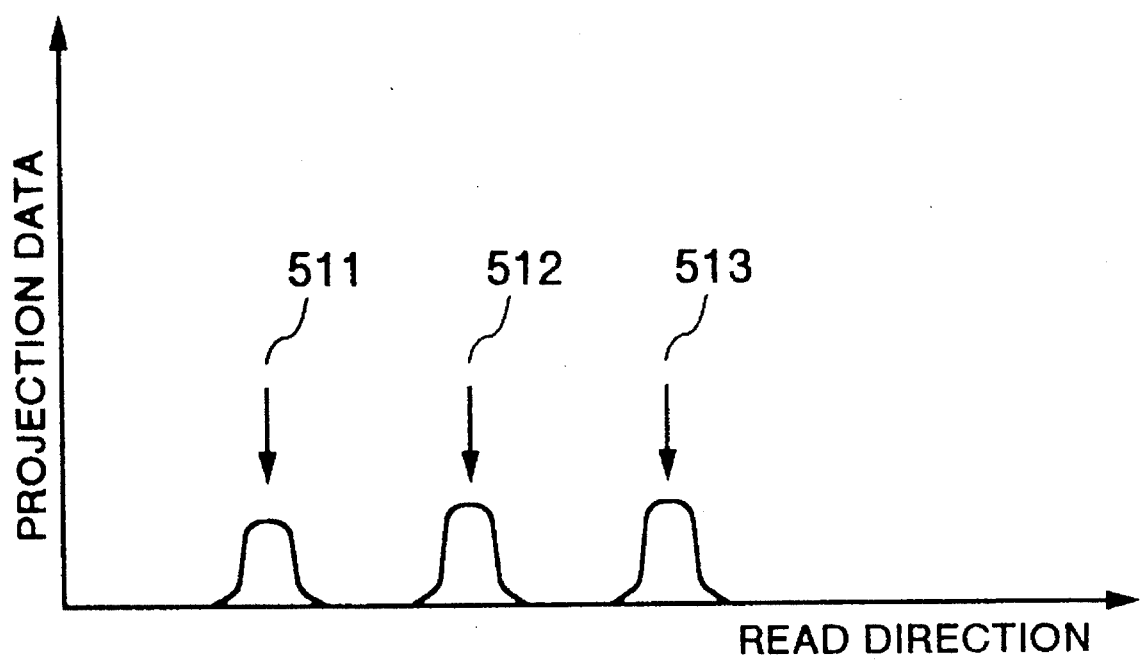
FIG. 17 is a view showing a projection of signals obtained in FIG. 16 after Fourier transform.

The inspection object having such marker balls fitted thereto is inserted into the inspection space 200 of the magnetic resonance imaging system, and the detection sequence shown in FIG. 16 and the analysis of the detection signals are executed at steps 102 and 108 shown in FIG. 3.

In FIG. 16, symbol [RF] represents the waveform of the RF magnetic field, [Gz] represents the waveform of the z-direction gradient magnetic field, [Gy] represents the waveform of the y-direction gradient magnetic field, and [Gx] represents the waveform of the x-direction gradient magnetic field. Symbol [A/D] represents the signal sampling period. As shown in [RF], alpha-degree RF pulses 411, 412, 413 are sequentially generated. The frequency band of these Rf pulses is brought into conformity with the chemical shift of the material of the marker balls. Accordingly, these Rf pulses do not excite magnetization of the living body as the imaging object but excite only magnetization of the marker balls. The flip angles of the RF pulses need not be always $\alpha°$, $\alpha°$, $\alpha°$ but may be 30°, 45°, 90°, respectively, for example. The z-direction gradient magnetic field 414 is applied at the back of the RF pulse 411, the y-direction gradient magnetic field 415 is applied at the back of the RF pulse 412 and the x-direction gradient magnetic field 416 is applied at the back of the RF pulse 413. In this way, the gradient echo which is frequency-encoded in the z-direction, the gradient echo which is frequency-encoded in the y-direction and the gradient echo which is frequency-encoded in the x-direction are sequentially generated. These echos are measured in the sampling periods represented by 501, 502 and 503, respectively.

The signals so obtained is subjected to Fourier transform by the processor 207 to obtain projection data, and the positions of the centers of the three marker balls in the z-, y- and x-directions are detected from the respective data. FIG. 18 typically shows the projection data obtained by subjecting the signal obtained in the sampling period 503 to Fourier transform. Mountains corresponding to the three marker balls 31, 32, 33 appear in the projection data as shown in FIG. 18. The center position 511, 512, 513 of each mountain corresponds to the center of each marker ball in the x-direction. There are various methods of finding out the center position of each mountain. The center position may be found out merely as a peak, or may be found out as the centroid of data above a predetermined level in order to improve accuracy. If a predetermined sequence is applied to the three marker balls 31, 32, 33, they can be easily distinguished, or they can be automatically judged from the size of the projection by making the sizes of the marker balls different. Incidentally, the frequency of the position of each point obtained in this way deviates by a frequency corresponding to the chemical shift, and a correct position can be obtained by correcting this frequency deviation.

The three-dimensional position of each marker ball can be detected from the projection data in the three directions in the way described above. Accordingly, the position and the direction of the inspection object having the marker fitted thereto can be monitored.

We claim:

1. In a magnetic resonance (MR) imaging system including means for generating a static magnetic field in an inspection space, means for generating gradient magnetic fields in three directions, respectively, means for generating a radio frequency (RF) magnetic field for exciting an inspection object, measurement means for measuring magnetic resonance signals from said inspection object, arithmetic means for executing various arithmetic operations inclusive of image reconstruction from detection signals for said detection signals, and control means for controlling execution of each of said means, a method of motion tracking measurement in MR imaging system comprising obtaining a plurality of sets of magnetic resonance signal data from a desired slice of said inspection object by repeating a plurality of times the following steps (a) to (c):

(a) a step of detecting physical quantities determining six kinds of freedom relating to parallel movement and rotation of a position/direction detection coordinate system defined on, and fixed to, said inspection object;

(b) a step of changing an intensity ratio of said gradient magnetic fields in said three directions with respect to intensity ratio of a prior step (b) for synthesizing a slice selection gradient magnetic field, and calculating a center frequency of an RF magnetic field to be simultaneously generated with a slice selection gradient magnetic field so that the position and the direction of an excitation slice follow the changes of the direction and the position of a desired slice to be imaged, said changes being caused by the movement of said inspection object; and (c) a step of selectively exciting magnetization of said excitation slice by generating said gradient magnetic fields having the changed intensity ratio in said three directions and said RF magnetic field having the calculated center frequency, and measuring the resulting magnetic resonance signals.

2. In a magnetic resonance (MR) imaging system including means for generating a static magnetic field in an inspection space, means for generating gradient magnetic fields in three directions, respectively, means for generating a radio frequency (RF) magnetic field for exciting an inspection object, measurement means for measuring magnetic resonance signals from said inspection object, arithmetic means for executing various arithmetic operations inclusive of image reconstruction from detection signals for said detection signals, and control means for controlling execution of each of said means, a method of motion tracking measurement in MR imaging system comprising:

(a) a step of setting a direction and a position of a desired slice to be imaged on said inspection object set in a reference position of said inspection space;

(b) a step of fixedly defining a coordinate system on said inspection object for detecting a position and direction of said inspection object, and determining a direction and an origin position of said coordinate system and determining a correlation between said coordinate system and said desired slice, and preserving data representing said correlation;

(c) a step of detecting physical quantities determining six kinds of freedom relating to parallel movement and rotation of said coordinate system;

(d) a step of calculating the direction and the position of said desired slice moved by the movement of said inspection object by using said preserved data representing said correlation, and the result of said detection, setting an intensity ratio of said gradient magnetic fields in said three directions which intensity ratio changes from a prior step (d) and the frequency of said RF magnetic field so that the position and the direction of an excitation slice are in conformity with the position and the direction of said desired slice moved, and executing an imaging operation; and (e) a step of repeating said steps (c) and (d) until the number of times of repetition of a predetermined imaging operation reaches a predetermined number of times.

3. A method of motion tracking measurement in MR imaging system according to claim 2, which further includes a step of setting the intensity ratio of said gradient magnetic fields in said three directions and the frequency of said RF magnetic field, before repetition of said steps (c) and (d), so that the direction and the position of said excitation slice are in conformity with the direction and the position of said desired slice set at said step (a), and then executing said imaging operation.

4. A method of motion tracking measurement in MR imaging system according to claim 2, wherein a plurality of markers are fitted to said inspection object, said step (b) detects three-dimensional positions of a plurality of said markers when said inspection object exists at a reference position, respectively, so as to determine the direction and the origin position of said coordinate system, and said step (c) detects once again the three-dimensional positions of a plurality of said markers, compares the detection result with the detection result of the three-dimensional positions of a plurality of said markers obtained at said step (b), and detects parallel movement and rotation of said coordinate system.

5. A method of motion tracking measurement in MR imaging system according to claim 4, wherein detection of the three-dimensional positions of a plurality of said markers at said steps (b) and (c) includes procedures for obtaining a plurality of optical images inclusive of a plurality of said markers by a plurality of fixed optical imaging apparatuses, and for detecting the positions of a plurality of said markers on a plurality of said optical images, respectively.

6. A method of motion tracking measurement in MR imaging system according to claim 4, wherein detection of the three-dimensional positions of a plurality of said markers at said steps (b) and (c) includes procedures for exciting a plurality of said markers by generating RF magnetic pulses by said RF magnetic field generation means, measuring MR signals under the state where said gradient magnetic field in one direction is generated, and repeating said excitation and said measurement by changing the direction of said gradient magnetic field.

7. A method of motion tracking measurement in MR imaging system according to claim 6, wherein a plurality of markers are made of a material having a chemical shift capable of excitation independently of said inspection object.

8. A method of motion tracking measurement in MR imaging system according to claim 2, wherein said step (b) executes a position/direction detection sequence for measuring a spherical region having a center thereof at an origin on a K space while said inspection object exists under said reference position, so as to obtain first position/direction detection signal data, and said step (c) executes once again said position/direction detection sequence so as to obtain second position/direction detection signal, and compares said first and second position/direction detection signal data to detect parallel movement and rotation of said coordinate system.

9. In a magnetic resonance (MR) imaging system including means for generating a static magnetic field in an inspection space, means for generating gradient magnetic fields in three directions, respectively, means for generating a radio frequency (RF) magnetic field for exciting an inspection object, measurement means for measuring magnetic resonance signals from said inspection object, arithmetic means for executing various arithmetic operations inclusive of image reconstruction from detection signals for said detection signals, and control means for controlling execution of each of said means, a method of motion tracking measurement in MR imaging system comprising:

(a) a step of determining a direction and a position of a desired slice to be imaged and a center position of an image to be imaged on said inspection object set in a reference position of said inspection space;

(b) a step of fixedly defining a coordinate system on said inspection object for detecting position and direction of said inspection object, and determining a direction and an origin position of said coordinate system defined, and obtaining a correlation between said coordinate system and said desired slice, and preserving data representing said correlation;

(c) a step of detecting physical quantities determining six kinds of freedom relating to parallel movement and rotation of said coordinate system of said inspection object;

(d) a step of calculating a direction and a position of said desired slice moved with the movement of said inspection object, by using said preserved data representing said correlation and said detected physical quantities, and obtaining an intensity ratio of said gradient magnetic fields in said three directions which intensity ratio changes from a prior step (d) for synthesizing a slice selection gradient magnetic field necessary for making the direction of said moved desired slice coincident with the direction of said excitation slice, obtaining a center frequency of an RF magnetic field necessary for making the position of said moved desired slice coincident with the position of said excitation slice, and a positional difference between said center position of said desired image and a center position of an image predicted by reconstructing a predicted measurement signal obtained by assuming that said moved desired slice is excited by using said slice selection gradient magnetic field and said RF magnetic field;

(e) a step of generating said gradient magnetic fields having the obtained intensity ratio of said three directions and said RF magnetic field having the obtained center frequency so as to selectively excite magnetization of said excitation slice, and measuring the resulting magnetic resonance signals;

(f) a step of correcting the phases of the magnetic resonance signals measured, on the basis of said position error;

(g) a step of repeating said steps (c) to (f) until the number of times of repetition of predetermined imaging operation reaches a predetermined number of times, and obtaining a plurality of phase-corrected magnetic resonance signal data; and (h) a step of reconstructing an image of said desired slice of said inspection object from a plurality of sets of said phase-corrected magnetic resonance signal data.

10. A method of motion tracking measurement in MR imaging system according to claim 9, which further includes a step of setting the intensity of each of said gradient magnetic fields in said three directions and the center frequency of said RF magnetic field, before repetition of said steps (c) to (f), so that the direction and the position of said excitation slice are in conformity with the direction and the position of said desired slice set at said step (a), and then executing the imaging operation.

11. A method of motion tracking measurement in MR imaging system according to claim 9, wherein a plurality of markers are fitted to said inspection object, said step (b) detects three-dimensional positions of a plurality of said markers when said inspection object exists at a reference position, respectively, so as to determine the direction and the origin position of said coordinate system, and said step (c) detects once again the three-dimensional positions of a plurality of said markers, compares the detection result with the detection result of the three-dimensional positions of a plurality of said markers obtained at said step (b), and detects parallel movement and rotation of said coordinate system.

12. A method of motion tracking measurement in MR imaging system according to claim 11, wherein detection of the three-dimensional positions of a plurality of said markers at said steps (b) and (c) includes procedures for obtaining a plurality of optical images inclusive of a plurality of said markers by a plurality of fixed optical imaging apparatuses, and for detecting the positions of a plurality of said markers on a plurality of said optical images, respectively.

13. A method of motion tracking measurement in MR imaging system according to claim 11, wherein detection of the three-dimensional positions of a plurality of said markers at said steps (b) and (c) includes procedures for exciting a plurality of said markers by generating RF magnetic pulses by said RF magnetic field generation means, measuring MR signals under the state where said gradient magnetic field in one direction is generated, and repeating said excitation and said measurement by changing the direction of said gradient magnetic field.

14. A method of motion tracking measurement in MR imaging system according to claim 13, wherein a plurality of markers are made of a material having a chemical shift capable of excitation independently of said inspection object.

15. A method of motion tracking measurement in MR imaging system according to claim 9, wherein said step (b) executes a position/direction detection sequence for measuring a spherical region having a center thereof at an origin on a K space while said inspection object exists under said reference position, so as to obtain first position/direction detection signal data, and said step (c) executes once again said position/direction detection sequence so as to obtain second position/direction detection signal, and compares said first and second position/direction detection signal data to detect parallel movement and rotation of said coordinate system.

16. A method of motion tracking measurement in MR imaging system according to claim 9, wherein said step (f) executes phase correction for the measurement signal data S (K, L) obtained by the measurement by said step (e) in accordance with the following equation:

$$S'(K, L) = S(K, L) \cdot \exp(-2\pi i \cdot (K \cdot \Delta X + L \cdot \Delta Y))$$

where

S'(K, L): signal data after phase correction

K: frequency spatial coordinate value in a read direction

L: frequency spatial coordinate value in an encode direction ΔX: position difference in the read direction obtained at step (d)

ΔY: position difference in the encode direction obtained at step (d).

17. A method of motion tracking measurement in MR imaging system according to claim 16, wherein said step (a) uses a position/direction detection sequence for measuring a circular region having a center thereof at an origin on a K space, and detects a position and a direction of the moving direction on the basis of signal data for position/direction detection obtained by the operation of said sequence.

18. A method of motion tracking measurement in MR imaging system according to claim 17, wherein detection of the position and the direction of the moving direction of said inspection object in the moving direction is executed by comparing reference position/direction signal data obtained by operating said position/direction detection sequence when said inspection object exists at a reference position with position/direction detection signal data obtained by operating said position/direction detection sequence when the position of said inspection object is desired to be known.

19. A method of motion tracking measurement in MR imaging system according to claim 18, wherein an absolute value is taken for each of said reference position/direction signal data and said position/direction detection signal data and is subjected to Fourier transform, a rotary angle inside the imaging plane is determined from an inclination of a first phase difference between Fourier transformed reference signal data and Fourier transformed detection signal data, and a position difference inside the imaging plane is determined from a second phase difference between correction data obtained by correcting said position/direction detection signal data by said rotary angle and said reference position/direction signal data.

20. In a magnetic resonance (MR) imaging system including means for generating a static magnetic field in an inspection space, means for generating gradient magnetic fields in three directions, respectively, means for generating a radio frequency (RF) magnetic field for exciting an inspection object, measurement means for measuring magnetic resonance signals from said inspection object, arithmetic means for executing various arithmetic operations inclusive of image reconstruction from detection signals for said detection signals, and control means for controlling execution of each of said means, a method of motion tracking measurement in MR imaging system comprising obtaining a plurality of sets of magnetic resonance signal data from a desired slice of said inspection object by repeating a plurality of times the following steps (a) to (c):

(a) a step of detecting physical quantities determining no more than five kinds of freedom relating to parallel movement and rotation of a position/direction detection coordinate system defined on, and fixed to, said inspection object, if at least one type of freedom is fixed;

(b) a step of changing an intensity ratio of said gradient magnetic fields in said three directions with respect to a prior step (b) for synthesizing a slice selection gradient magnetic field, and calculating a center frequency of an Rf magnetic field to be simultaneously generated with a slice selection gradient magnetic field so that the position and the direction of an excitation slice follow the changes of the direction and the position of a desired slice to be imaged, said changes being caused by the movement of said inspection object; and (c) a step of selectively exciting magnetization of said excitation slice by generating said gradient magnetic fields having the changed intensity ratio in said three directions and said RF magnetic field having the calculated center frequency, and measuring the resulting magnetic resonance signals.

* * * * *